(12) United States Patent
Sakaguchi et al.

(10) Patent No.: US 12,211,551 B2
(45) Date of Patent: Jan. 28, 2025

(54) SEMICONDUCTOR MEMORY DEVICE

(71) Applicant: Kioxia Corporation, Tokyo (JP)

(72) Inventors: Natsuki Sakaguchi, Chiyoda Tokyo (JP); Takashi Maeda, Kamakura Kanagawa (JP); Rieko Funatsuki, Yokohama Kanagawa (JP); Hidehiro Shiga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 140 days.

(21) Appl. No.: 18/177,704

(22) Filed: Mar. 2, 2023

(65) Prior Publication Data

US 2024/0096413 A1    Mar. 21, 2024

(30) Foreign Application Priority Data

Sep. 21, 2022 (JP) .................................. 2022-150591

(51) Int. Cl.
   *G11C 16/04* (2006.01)
   *G11C 7/06* (2006.01)
   *G11C 16/24* (2006.01)

(52) U.S. Cl.
   CPC .......... *G11C 16/0433* (2013.01); *G11C 7/065* (2013.01); *G11C 16/24* (2013.01)

(58) Field of Classification Search
   CPC ..... G11C 16/0433; G11C 16/24; G11C 16/10; G11C 16/0483; G11C 16/26; G11C 7/065; G11C 11/2255; G11C 11/2257; G11C 11/2259; G11C 11/223; G11C 11/2273; G11C 11/2275

See application file for complete search history.

(56) References Cited

U.S. PATENT DOCUMENTS

| 2005/0226055 | A1  | 10/2005 | Guterman |
| 2007/0189056 | A1  | 8/2007  | Joo et al. |
| 2019/0088313 | A1* | 3/2019  | Kondo ................ G11C 11/5642 |
| 2022/0189569 | A1  | 6/2022  | Kato |

FOREIGN PATENT DOCUMENTS

JP          2022095248 A      6/2022

* cited by examiner

*Primary Examiner* — Sultana Begum
(74) *Attorney, Agent, or Firm* — Kim & Stewart LLP

(57) ABSTRACT

A control circuit of a semiconductor memory device performs a write operation on a memory cell transistor of the semiconductor memory device by performing a first pulse application operation of lowering a threshold voltage of the memory cell transistor, a precharge operation, and then a second pulse application operation. In the precharge operation, in a state in which first and second select transistors connected to the memory cell transistor are turned on, a bit line connected to the memory cell transistor is charged by applying a ground voltage to a word line connected to a gate of the memory cell transistor and applying a voltage higher than the ground voltage to a source line. In the second pulse application operation, in a state in which the first select transistor is turned on and the second select transistor is turned off, a program voltage is applied to the word line.

20 Claims, 25 Drawing Sheets

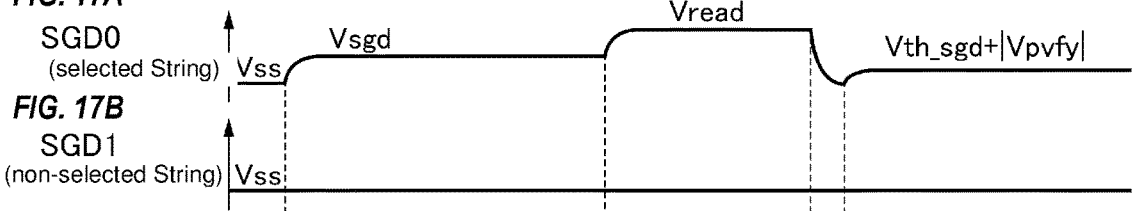
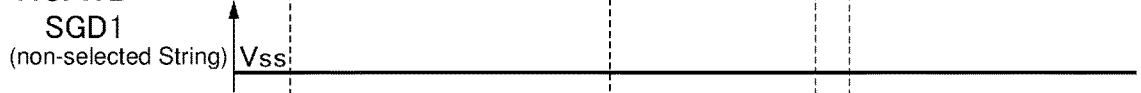
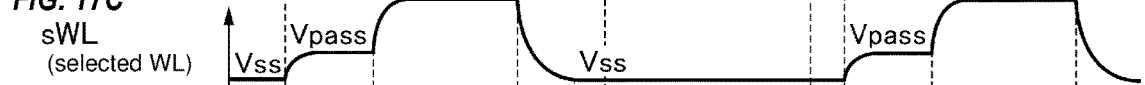
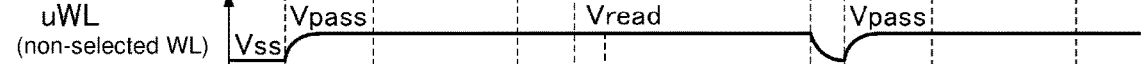
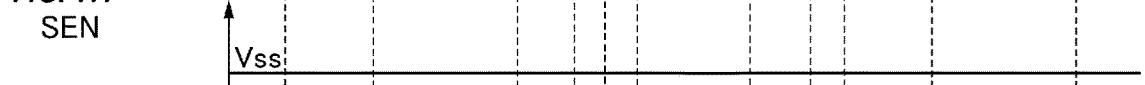
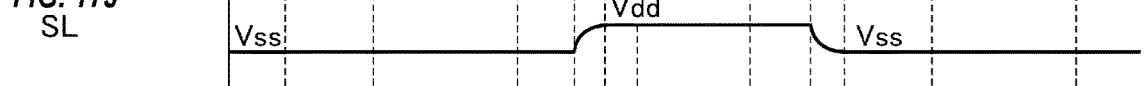
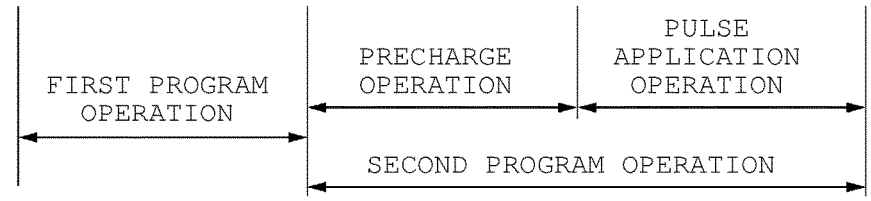

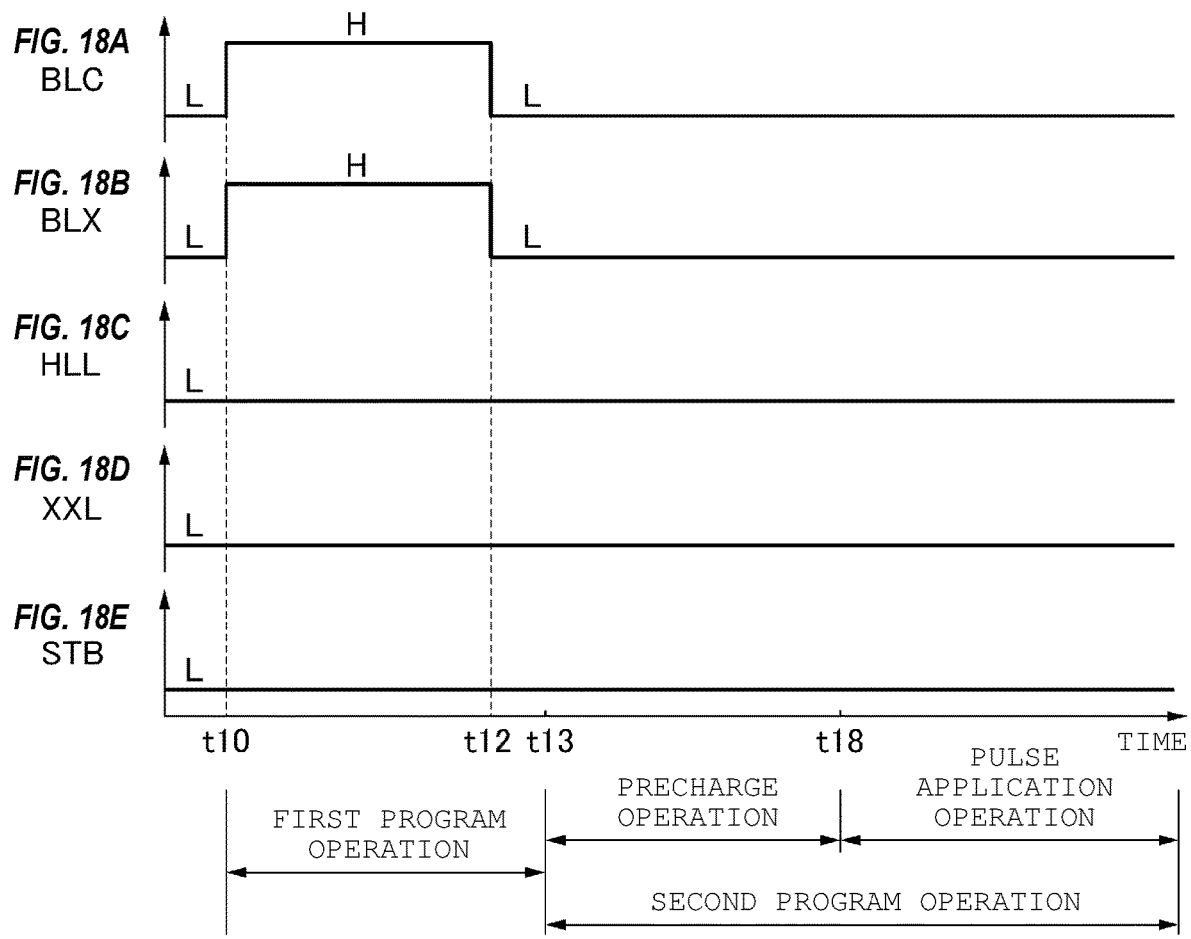

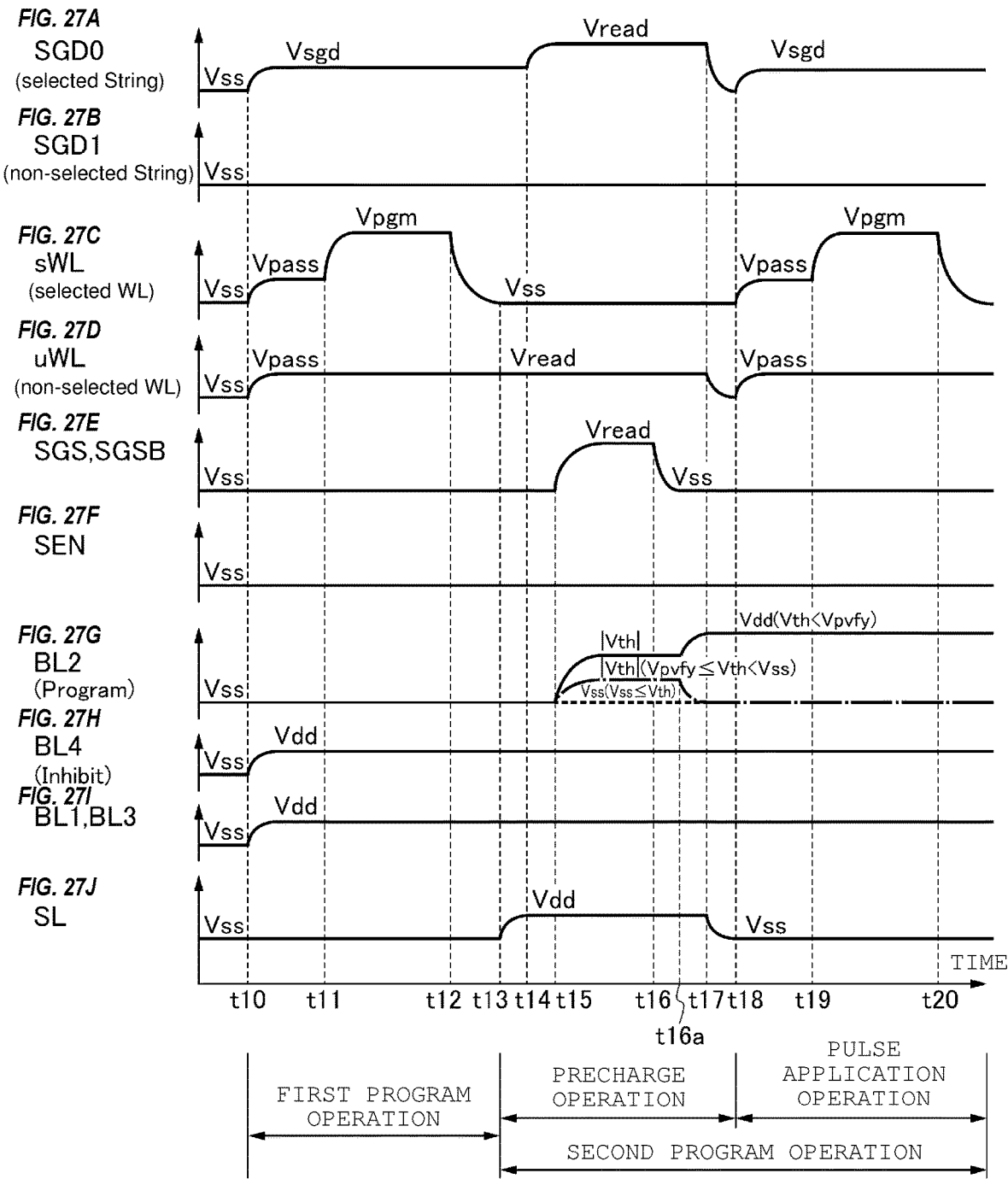

SEMICONDUCTOR MEMORY DEVICE

CROSS-REFERENCE TO RELATED APPLICATION

This application is based upon and claims the benefit of priority from Japanese Patent Application No. 2022-150591, filed Sep. 21, 2022, the entire contents of which are incorporated herein by reference.

FIELD

Embodiments described herein relate generally to a semiconductor memory device.

BACKGROUND

In a semiconductor memory device, a write operation for a memory cell transistor is performed by repeatedly executing a program operation and a verify operation on the memory cell transistor.

DESCRIPTION OF THE DRAWINGS

FIGS. 17A to 17J are timing charts illustrating voltage transitions of various components of the memory cell array during the write operation according to the first embodiment.

FIGS. 18A to 18E are timing charts illustrating transitions in signals applied to a sense amplifier unit in the write operation according to the first embodiment.

FIG. 19 is a chart illustrating a relationship between a threshold voltage of the memory cell transistor and a charging voltage of a bit line in the semiconductor memory device according to the first embodiment.

FIGS. 27A to 27J are timing charts illustrating a voltage transitions of various components of a memory cell array during a write operation according to the third embodiment.

DETAILED DESCRIPTION

Figure 1:
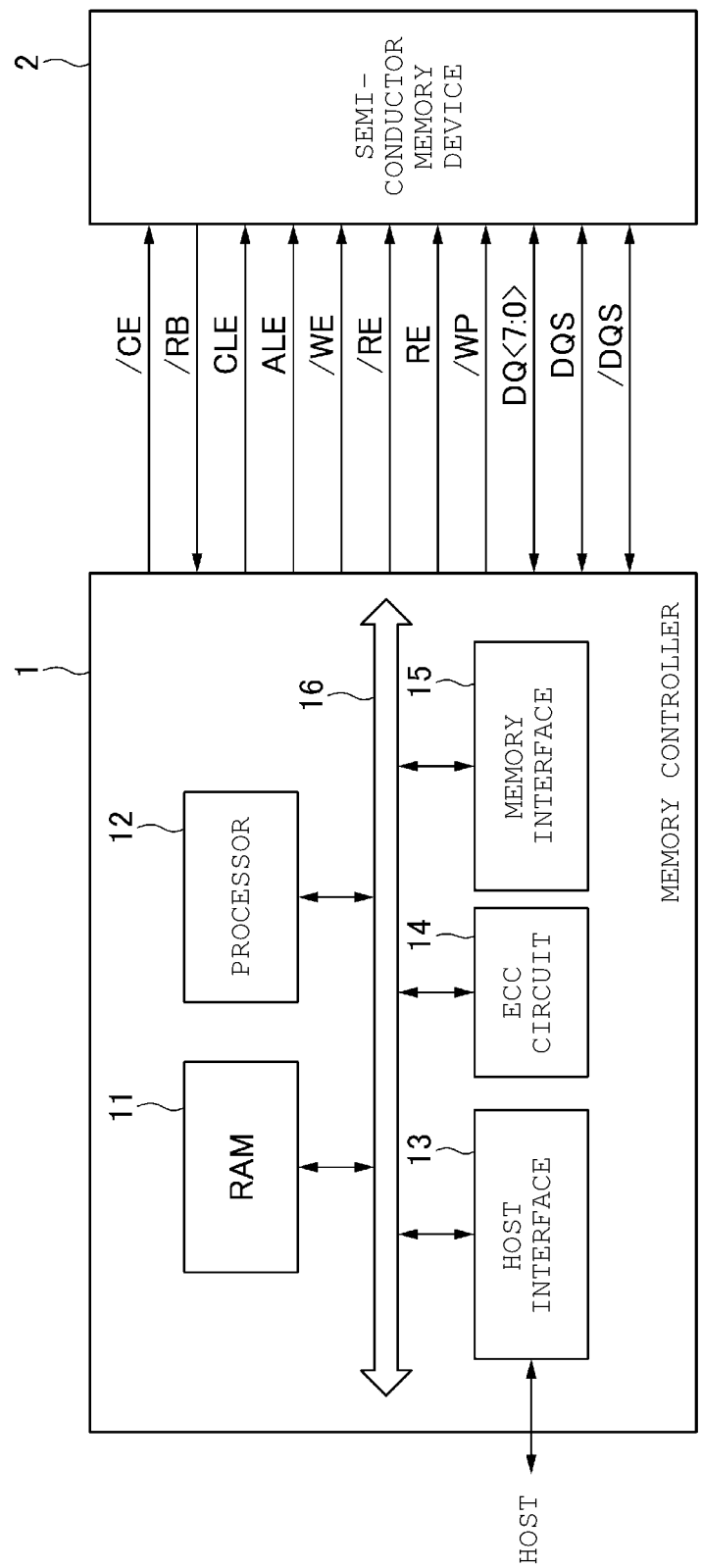
FIG. 1 is a block diagram illustrating a schematic configuration of a memory system according to a first embodiment.

Embodiments provide a semiconductor memory device capable of performing a write operation at a higher speed.

In general, according to one embodiment, a semiconductor memory device includes a memory string, a plurality of word lines, a sense amplifier unit, and a control circuit. The memory string includes a first select transistor having a first end connected to a bit line, a second select transistor having a first end connected to a source line, and a plurality of memory cell transistors connected in series between a second end of the first select transistor and a second end of the second select transistor. The plurality of word lines are connected to the gates of the plurality of memory cell transistors, respectively. The sense amplifier unit is connected to the bit line, and includes a latch circuit storing data to be written to the memory cell transistors, and a sense amplifier circuit capable of applying a voltage to the bit line based on the data stored in the latch circuit. The control circuit is configured to control voltages applied to the plurality of word lines, the bit line, and the source line. The control circuit executes a first pulse application operation, a precharge operation, and then a second pulse application operation when executing a write operation on a first memory cell transistor, which is one of the memory cell transistors. In the first pulse application operation, in a state in which the first select transistor is turned on and the second select transistor is turned off, a first voltage is applied to a first word line connected to a gate of the first memory cell transistor, and a second voltage lower than the first voltage is applied to the bit line, so that a threshold voltage of the first memory cell transistor is lowered. In the precharge operation, in a state in which the first select transistor and the second select transistor are turned on, a third voltage lower than the first voltage is applied to the first word line, and a fourth voltage higher than the third voltage is applied to the source line, so that the bit line is charged. In the second pulse application operation, in a state in which the bit line is set to a floating state by the sense amplifier unit by turning on the first select transistor and turning off the second select transistor, the first voltage is applied to the first word line.

Hereinafter, embodiments will be described with reference to the drawings. In order to facilitate understanding of the description, in each drawing, the same components are denoted by the same reference numerals as much as possible, and redundant descriptions are omitted.

1. FIRST EMBODIMENT

A semiconductor memory device according to a first embodiment will be described. The semiconductor memory device according to this embodiment is a non-volatile memory device configured as a NAND flash memory.

1.1. Configuration of Memory System

FIG. 1 illustrates a configuration example of a memory system including a semiconductor memory device 2. This memory system includes a memory controller 1 and the semiconductor memory device 2. The memory system in FIG. 1 can be connected to a host (not illustrated). The host is, for example, an electronic device such as a personal computer or a mobile terminal.

The memory controller 1 controls writing of data to the semiconductor memory device 2 based on a write request from the host. In addition, the memory controller 1 also controls reading of data from the semiconductor memory device 2 based on a read request from the host.

A chip enable signal /CE, a ready/busy signal /RB, a command latch enable signal CLE, an address latch enable signal ALE, a write enable signal /WE, read enable signals /RE and RE, a write protect signal /WP, data signals DQ<7:0>, and data strobe signals DQS and /DQS are transmitted and received between the memory controller 1 and the semiconductor memory device 2.

The chip enable signal /CE is a signal for enabling the semiconductor memory device 2. The ready/busy signal /RB is a signal indicating whether the semiconductor memory device 2 is in a ready state or a busy state. The "ready state" is a state in which an external command can be received. The "busy state" is a state in which an external command cannot be received. The command latch enable signal CLE is a signal indicating that the signal DQ<7:0> is a command. The address latch enable signal ALE is a signal indicating that the signal DQ<7:0> is an address. The write enable signal /WE is a signal for taking in the signal received by the semiconductor memory device 2 and is asserted each time the memory controller 1 transmits a command, an address, and data. The memory controller 1 instructs the semiconductor memory device 2 to take in the signals DQ<7:0> while the signal /WE is at an "L (Low)" level.

The read enable signals RE and /RE are signals for allowing the memory controller 1 to read data from the semiconductor memory device 2. The read enable signals RE and /RE are used, for example, to control the operation timing of the semiconductor memory device 2 when the signals DQ<7:0> are output from the semiconductor memory device 2. The write protect signal /WP is a signal for instructing the semiconductor memory device 2 to prohibit writing and erasing of data. The signals DQ<7:0> contain data transmitted and received between the semiconductor memory device 2 and the memory controller 1 and include commands, addresses, and data. The data strobe signals DQS and /DQS are signals for controlling input/output timings of the signals DQ<7:0>.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are interconnected via an internal bus 16.

The host interface 13 outputs requests received from the host, the user data (write data), or the like to the internal bus 16. The host interface 13 also transmits the user data read from the semiconductor memory device 2 and responses from the processor 12 to the host.

The memory interface 15 controls the process of writing the user data and the like to the semiconductor memory device 2 and the process of reading the data from the semiconductor memory device 2 based on instructions from the processor 12.

The processor 12 controls the memory controller 1. The processor 12 is, for example, a CPU, an MPU, or the like. When receiving a request from the host via the host interface 13, the processor 12 performs control based on the request. For example, the processor 12 instructs the memory interface 15 to write the user data and the parity to the semiconductor memory device 2 based on the request from the host. The processor 12 also instructs the memory interface 15 to read the user data and the parity from the semiconductor memory device 2 based on the request from the host.

The processor 12 determines a storage area (memory area) in the semiconductor memory device 2 for the user data accumulated in the RAM 11. The user data is stored in the RAM 11 via the internal bus 16. The processor 12 performs determination of the memory area for the data (page data) in units of a page, which is a unit of writing. The user data stored in one page of the semiconductor memory device 2 is hereinafter also referred to as "unit data". The unit data is generally encoded and stored as a code word in the semiconductor memory device 2. The encoding is optional in this embodiment. The memory controller 1 may store the unit data in the semiconductor memory device 2 without the encoding, but FIG. 1 illustrates a configuration in which the encoding is performed as a configuration example. When the memory controller 1 does not perform the encoding, the page data matches the unit data. In addition, one code word may be generated based on one unit data, or one code word may be generated based on divided data obtained by dividing the unit data. In addition, one code word may be generated by using a plurality of the unit data.

The processor 12 determines a memory area of the semiconductor memory device 2 as a writing destination for each unit data. A physical address is assigned to the memory area of the semiconductor memory device 2. The processor 12 manages the memory area of the writing destination of the unit data by using the physical address. The processor 12 instructs the memory interface 15 to specify the determined memory area (physical address) and write the user data to the semiconductor memory device 2. The processor 12 manages correspondence between the logical address of the user data (logical address managed by the host) and physical address. When the processor 12 receives the read request including the logical address from the host, the processor 12 identifies the physical address corresponding to the logical address, designates the physical address, and instructs the memory interface 15 to read the user data.

The ECC circuit 14 encodes the user data stored in the RAM 11 to generate code words. The ECC circuit 14 also decodes code words read from the semiconductor memory device 2.

The RAM 11 temporarily stores the user data received from the host until the user data is stored in the semiconductor memory device 2 and temporarily stores the data read from the semiconductor memory device 2 until the data is transmitted to the host. The RAM 11 is a general-purpose memory such as an SRAM or a DRAM.

FIG. 1 illustrates a configuration example in which the memory controller 1 includes the ECC circuit 14 and the memory interface 15, respectively. However, the ECC circuit 14 may be built into the memory interface 15. In addition, the ECC circuit 14 may be incorporated in the semiconductor memory device 2. The specific configuration and arrangement of each element illustrated in FIG. 1 are not particularly limited.

When receiving the write request from the host, the memory system of FIG. 1 operates as follows. The processor 12 temporarily stores data that is a writing target to the RAM 11. The processor 12 reads the data stored in the RAM 11 and inputs the data to the ECC circuit 14. The ECC circuit 14 encodes the input data and inputs a code word to the memory interface 15. The memory interface 15 writes the input code word to the semiconductor memory device 2.

When receiving the read request from the host, the memory system of FIG. 1 operates as follows. The memory interface 15 inputs the code word read from the semiconductor memory device 2 to the ECC circuit 14. The ECC circuit 14 decodes the input code word and stores the decoded data in the RAM 11. The processor 12 transmits the data stored in the RAM 11 to the host via the host interface 13.

1.2 Configuration of Semiconductor Memory Device

Figure 2:
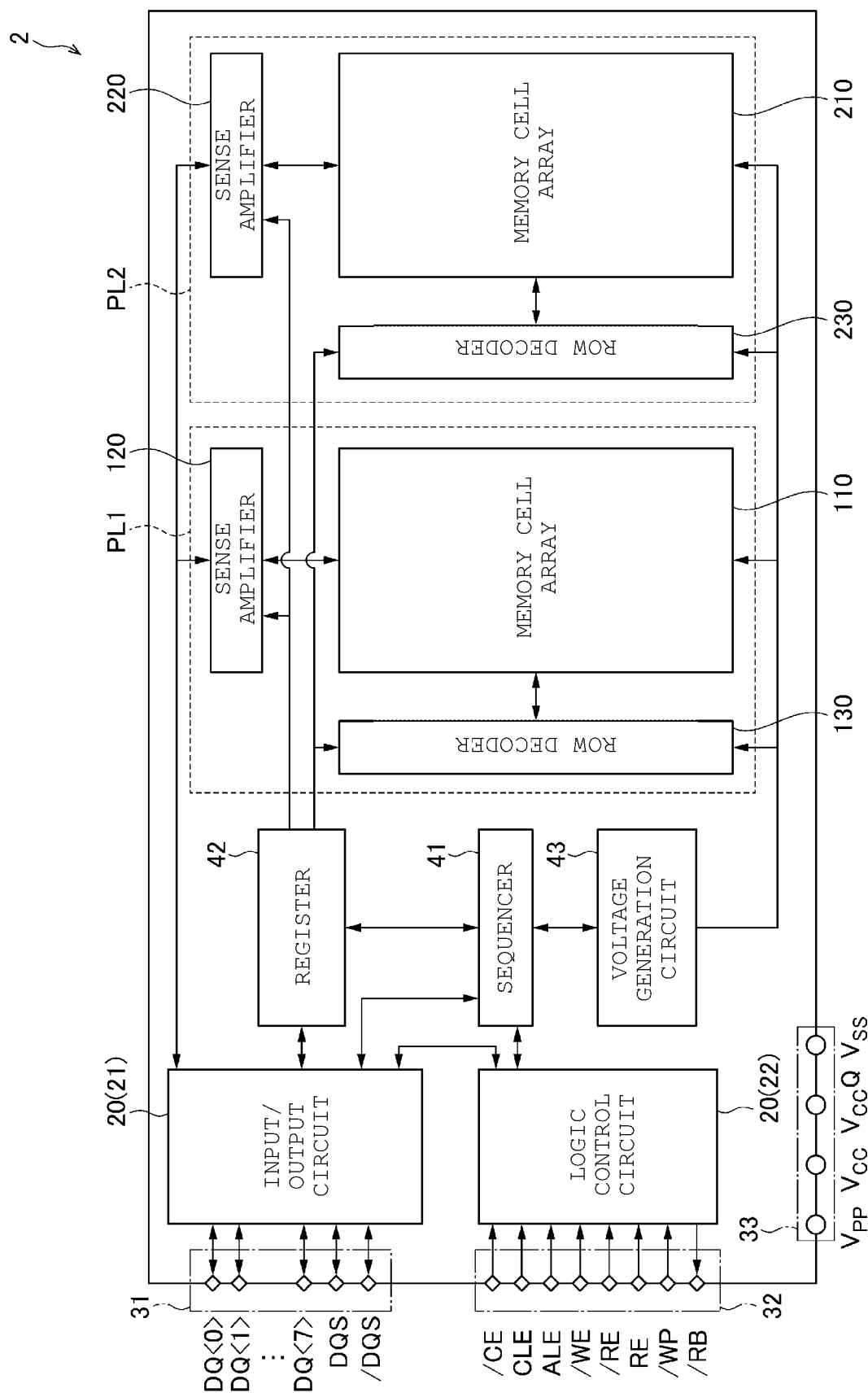
FIG. 2 is a block diagram illustrating a schematic configuration of a semiconductor memory device according to the first embodiment.

As illustrated in FIG. 2, the semiconductor memory device 2 includes two planes PL1 and PL2, an input/output circuit 21, a logic control circuit 22, a sequencer 41, a register 42, a voltage generation circuit 43, an input/output pad group 31, a logic control pad group 32, and a power supply input terminal group 33.

The plane PL1 has a memory cell array 110, a sense amplifier 120, and a row decoder 130. The plane PL2 has the same configuration as the plane PL1 and includes a memory cell array 210, a sense amplifier 220, and a row decoder 230. The number of planes provided in the semiconductor memory device 2 may be two as in this embodiment, but may be one, or may be three or more.

The sense amplifier 120 of the plane PL1 is a circuit for adjusting the voltage applied to the bit lines of the memory cell array 110, and reading the current or voltage of the bit lines, to convert the current or voltage into data. When reading data, the sense amplifier 120 acquires read data read from the memory cell transistors of the memory cell array 110 to the bit lines and transfers the acquired read data to the input/output circuit 21. When writing data, the sense amplifier 120 transfers write data to the memory cell transistors of the memory cell array 110 via the bit lines.

The row decoder 130 of the plane PL1 is a circuit configured as a switch group (not illustrated) for applying a voltage to each word line of the memory cell array 110. The row decoder 130 receives a block address and a row address from the register 42, selects a corresponding block based on the block address, and selects a corresponding word line based on the row address. The row decoder 130 switches between opening and closing of the switch group so that a voltage from the voltage generation circuit 43 is applied to the selected word line.

The memory cell array 210 of the plane PL2 has the same configuration as the memory cell array 110 of the plane PL1, the sense amplifier 220 of the plane PL2 has the same configuration as the sense amplifier 120 of the plane PL1, and the row decoder 230 of the plane PL2 has the same configuration as the row decoder 130 of plane PL1.

The memory cell arrays 110 and 210 are parts for storing data. Each of the memory cell arrays 110 and 210 includes a plurality of the memory cell transistors associated with the word lines and the bit lines.

The input/output circuit 21 transmits and receives the signals DQ<7:0> and data strobe signals DQS and/DQS to and from the memory controller 1. The input/output circuit 21 transfers the command and the address in the signals DQ<7:0> to the register 42. The input/output circuit 21 also transmits and receives the write data and the read data to and from the sense amplifiers 120 and 220.

The logic control circuit 22 receives the chip enable signal/CE, the command latch enable signal CLE, the address latch enable signal ALE, the write enable signal/WE, the read enable signals/RE and RE, and the write protect signal/WP from the memory controller 1. The logic control circuit 22 also transfers the ready/busy signal/RB to the memory controller 1 to notify the state of the semiconductor memory device 2 to the outside.

Both the input/output circuit 21 and the logic control circuit 22 are circuits for inputting/outputting signals to/from the memory controller 1. The input/output circuit 21 and the logic control circuit 22 are hereinafter also referred to as an "interface circuit 20". The interface circuit 20 can be regarded as a part to and from which signals including the control signals relating to the operations of the planes PL1 and PL2 are input and output. The control signal is, for example, the command and the address in the signal DQ<7:0> input to the input/output circuit 21, the command latch enable signal CLE input to the logic control circuit 22, or the like.

The sequencer 41 controls the operation of each of the components such as the memory cell arrays 110 and 210 based on the control signal input from the memory controller 1 to the interface circuit 20. In this embodiment, the sequencer 41 corresponds to the control circuit. The sequencer 41 and the logic control circuit 22 may also be used as the control circuit of this embodiment.

The register 42 temporarily stores the commands and the addresses. The command for instructing the write operations, the erasing operations, or the like of the planes PL1 and PL2 and the address corresponding to the command are input from the memory controller 1 to the input/output circuit 21, and after that, are transferred from the input/output circuit 21 to the register 42 and stored in the register 42.

The register 42 also stores status information indicating the state of the semiconductor memory device 2. The sequencer 41 updates the status information stored in the register 42. The status information is output from the input/output circuit 21 to the memory controller 1 as a status signal in response to a request from the memory controller 1.

The voltage generation circuit 43 generates the voltage required for each of the write operation, the read operation, and the erasing operation of the data in the memory cell arrays 110 and 210 based on the instructions from the sequencer 41. Such voltages include, for example, the voltages applied to the word lines and the bit lines, which will be described later.

The input/output pad group 31 is a portion provided with a plurality of terminals (pads) for transmitting and receiving the respective signals between the memory controller 1 and the input/output circuit 21. A terminal is separately provided for each of the signals DQ<7:0> and the data strobe signals DQS and/DQS.

The logic control pad group 32 is a portion provided with a plurality of terminals (pads) for transmitting and receiving the respective signals between the memory controller 1 and the logic control circuit 22. The terminals correspond respectively to the chip enable signal/CE, the command latch enable signal CLE, the address latch enable signal ALE, the write enable signal /WE, the read enable signals/RE and RE, the write protect signal/WP, and the ready-busy/signal /RB.

The power supply input terminal group 33 is provided with a plurality of terminals for receiving voltages required for the operation of the semiconductor memory device 2. Voltages supplied to the respective terminals include power supply voltages Vcc, VccQ, and Vpp and a ground voltage Vss.

The power supply voltage Vcc is a circuit power supply voltage externally supplied as an operating power supply and is a voltage of, for example, about 3.3 V. The power supply voltage VccQ is, for example, a voltage of 1.2 V. The power supply voltage VccQ is a voltage used for signal transmission/reception between the memory controller 1 and the semiconductor memory device 2. The power supply voltage Vpp is a power supply voltage higher than the power supply voltage Vcc, for example, a voltage of 12 V.

1.3 Configuration of Memory Cell Array

Figure 3:
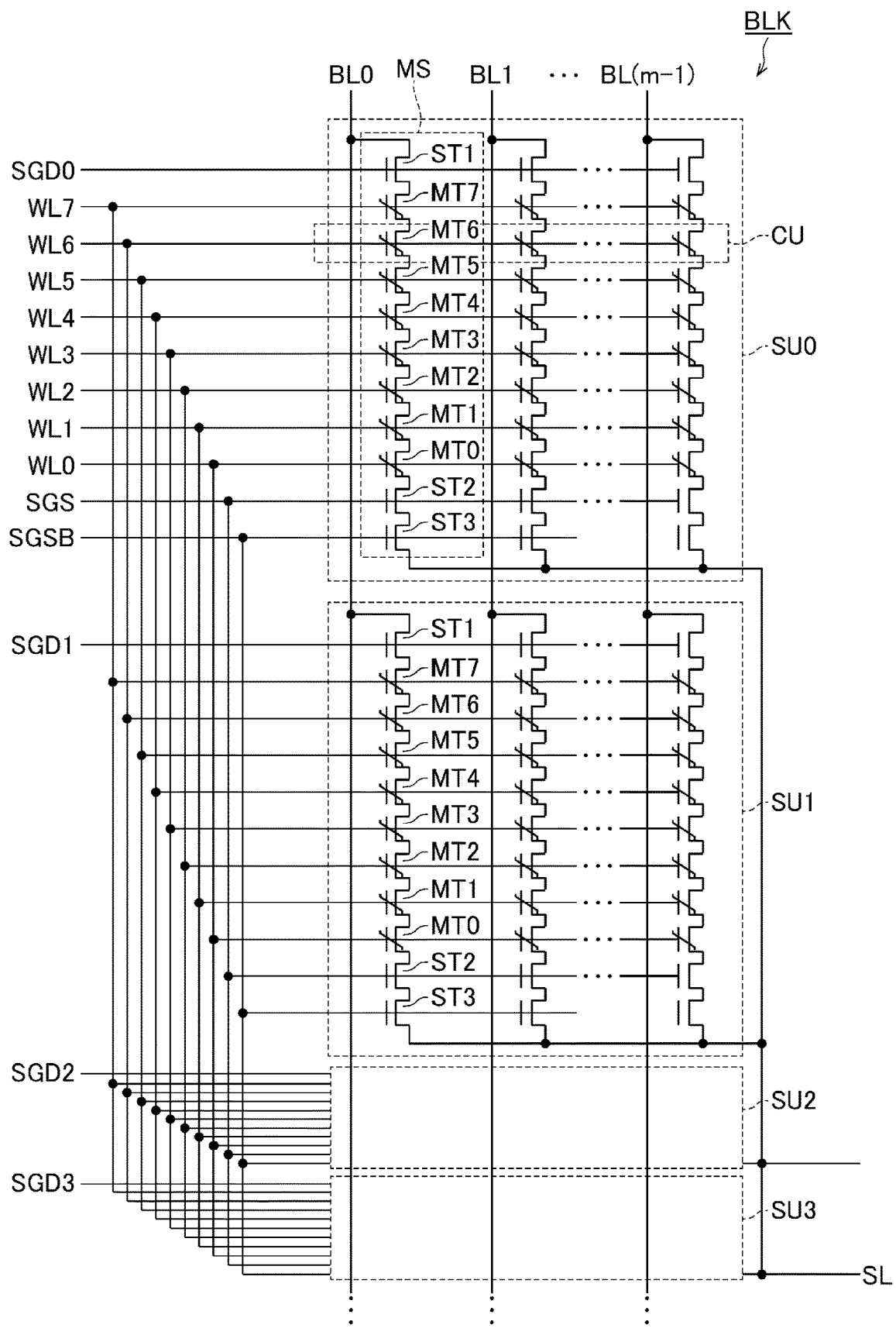
FIG. 3 is a circuit diagram illustrating an equivalent circuit of a memory cell array according to the first embodiment.

FIG. 3 illustrates the configuration of the memory cell array 110 provided in the plane PL1. The memory cell array 110 is configured with a plurality of blocks BLK, but only one block BLK among the plurality of blocks BLK is illustrated in FIG. 3. The configuration of other blocks BLK provided in the memory cell array 110 is the same as that illustrated in FIG. 3.

As illustrated in FIG. 3, the block BLK includes, for example, four string units SU (SU0 to SU3). Each string unit SU also includes a plurality of the memory strings MS. Thus, the memory cell array 110 has the plurality of memory strings MS, and each memory string MS belongs to one of the plurality of string units SU. The number of string units SU may differ from the example of FIG. 3.

Each memory string MS includes, for example, eight memory cell transistors MT (MT0 to MT7), a drain-side select transistor ST1, and source-side select transistors ST2 and ST3 and has a configuration in which these components are connected in series. In this embodiment, the drain-side select transistor ST1 corresponds to the first select transistor, and the source-side select transistors ST2 and ST3 correspond to the second select transistors.

It is noted that the number of memory cell transistors MT provided in each memory string MS is not limited to eight, and may be, for example, 32, 48, 64, or 96. In addition, in order to improve the cutoff characteristics, each or any one of the drain-side select transistor ST1 and the source-side select transistors ST2 and ST3 may be configured with a plurality of transistors instead of a single transistor. In addition, the configuration in which the source-side select transistor ST3 is omitted may be used. Furthermore, a dummy cell transistor may be provided between the memory cell transistor MT and the drain-side select transistor ST1 and between the memory cell transistor MT and the source-side select transistor ST2.

The respective memory cell transistors MT are connected in series between the drain-side select transistor ST1 and to the source-side select transistor ST2. The memory cell transistor MT7 on one end side is connected to the source of the drain-side select transistor ST1, and the memory cell transistor MT0 on the other end side is connected to the drain of the source-side select transistor ST2.

The memory cell array 110 is provided with the m bit lines BL (BL0, BL1, . . . , and BL(m−1)). "m" is an integer representing the number of memory strings MS provided in one string unit SU.

Among the plurality of memory strings MS, the memory strings MS belonging to the same string unit SU are connected to the different bit lines BL via the drain-side select transistors ST1. The gates of the respective drain-side select transistors ST1 belonging to the same string unit SU are commonly connected to the gate lines SGD0 to SGD3, which are separately provided for each string unit SU. For example, the gates of the respective drain-side select transistors ST1 belonging to the string unit SU0 are commonly connected to the gate line SGD0 provided corresponding to the string unit SU0.

The gates of the respective drain-side select transistors ST1 belonging to other string units SU1 and the like are similarly commonly connected to the gate line provided corresponding to the string unit SU. It is noted that the gate line SGD0 is a gate line provided corresponding to the string unit SU0, the gate line SGD1 is a gate line provided corresponding to the string unit SU1, the gate line SGD2 is a gate line provided corresponding to the string unit SU2, and the gate line SGD3 is a gate line provided corresponding to the string unit SU3.

In each string unit SU, the source of the source-side select transistor ST2 is connected to the drain of the source-side select transistor ST3. The source of the source-side select transistor ST3 is connected to the source line SL. The source line SL is commonly connected to each of the sources of the plurality of source-side select transistors ST2 provided in the block BLK. In this manner, the plurality of memory strings MS are commonly connected to the same source line SL via the respective source-side select transistors ST2 and ST3.

The gates of the source-side select transistors ST2 provided in the block BLK are commonly connected to the same gate line SGS. Similarly, the gates of the source-side select transistors ST3 provided in the block BLK are commonly connected to the same gate line SGSB.

The gates of the memory cell transistors MT0 provided in the same block BLK are commonly connected to a word line WL0. The gates of the memory cell transistors MT1 provided in the same block BLK are commonly connected to a word line WL1. The same applies to other memory cell transistors MT. That is, the gates of the memory cell transistors MT0 to MT7 are commonly connected to the word lines WL (one of WL0 to WL7) respectively correspondingly provided.

A set of a plurality of the memory cell transistors MT connected to a common word line WL in one string unit SU is referred to as, for example, a cell unit CU. A set of 1-bit data stored in each memory cell transistor MT of one cell unit CU is referred to as a "page". In this embodiment, 1-bit data is stored in each memory cell transistor MT. Therefore, data for one page is stored in each cell unit CU. Alternatively, data for a plurality of pages may be stored in each cell unit CU.

1.4 Structure of Memory Cell Array

Figure 4:
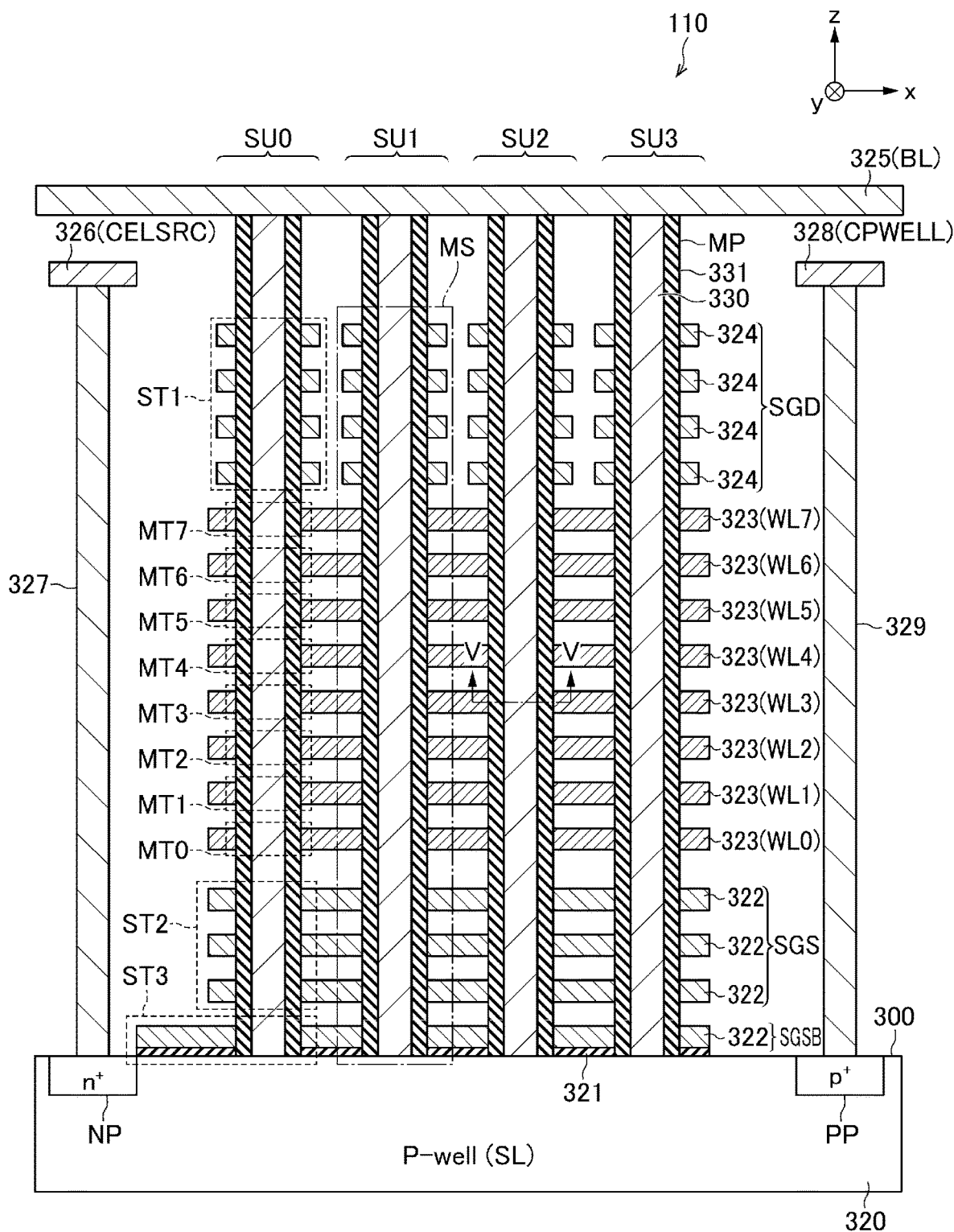
FIG. 4 is a cross-sectional view illustrating a cross-sectional structure of the memory cell array according to the first embodiment.

FIG. 4 is an example of a cross-sectional structure of the memory cell array 110 and illustrates an extracted structure corresponding to one block BLK.

In the cross-sectional view of FIG. 4, some components such as an insulating layer (interlayer insulating film), wirings, and contacts are appropriately omitted in order to facilitate viewing of the drawings. In addition, the x direction illustrated in FIG. 4 corresponds to the extension direction of the bit line BL. The y direction corresponds to the extension direction of the word line WL. The z direction corresponds to the direction perpendicular to the upper surface of the semiconductor substrate 300 on which the semiconductor memory device 2 is formed.

As illustrated in FIG. 4, the region of the semiconductor substrate 300 where the memory cell array 110 is formed includes, for example, a P-type well region 320, an insulator layer 321, four conductive layers 322, eight conductive layers 323, four conductive layers 324, a plurality of memory pillars MP, conductive layers 325, 326, and 328, and contacts 327 and 329. It is noted that an insulating layer (not illustrated) is formed between conductive layers.

The P-type well region 320 is provided near the upper surface of the semiconductor substrate 300. The P-type well region 320 is used as the source line SL. The P-type well region 320 includes an n+ impurity diffusion region NP and a p+ impurity diffusion region PP spaced apart from each other. Each of the n+ impurity diffusion region NP and the p+ impurity diffusion region PP is provided near the upper surface of the P-type well region 320.

The insulator layer 321 is provided on the P-type well region 320. The four conductive layers 322 stacked apart from each other are provided on the insulator layer 321. The eight conductive layers 323 stacked apart from each other are provided above the uppermost conductive layer 322. The four conductive layers 324 stacked apart from each other are provided above the conductive layer 323. The conductive layer 325 is provided above the uppermost conductive layer 324.

Each conductive layer 322 has a structure extending along an xy plane. The lowermost conductive layer 322 is used as the gate line SGSB. The three conductive layers 322 provided above the lowermost conductive layer 322 are used as the gate lines SGS. In FIG. 4, the three source-side select transistors ST2 and the one source-side select transistor ST3 are provided. The same number of conductive layers 322 as the total number of source-side select transistors ST2 and the source-side select transistors ST3 are provided.

The conductive layer 323 has a structure extending along the xy plane. The eight conductive layers 323 are used as the word lines WL0, WL1, WL2, . . . , and WL7 in this order from the lower layer.

The conductive layer 324 has a structure extending in the y direction. The conductive layer 324 is used as a select gate line SGD. In the example of FIG. 4, three drain-side select transistors ST1 are provided. The same number of conductive layers 324 as the total number of drain-side select transistors ST1 are provided.

The conductive layer 325 has a structure extending in the x direction. The conductive layer 325 is used as the bit line BL. The plurality of conductive layers 325 are arranged in the y direction.

Each memory pillar MP corresponds to one memory string MS. The memory pillars MP are arranged in each of the x direction and the y direction. As illustrated in FIG. 4, each memory pillar MP arranged in the x direction is connected to the same conductive layer 325 (that is, the bit line BL).

Each memory pillar MP arranged in the y direction is connected to different conductive layers 325 (that is, the bit lines BL). As illustrated in FIG. 4, these groups of the memory pillars MP arranged in the y direction belong to the same string unit SU.

Each memory pillar MP penetrates the insulator layer 321, the four conductive layers 322, the eight conductive layers 323, and the four conductive layers 324. All of the portions of the memory pillar MP intersecting the above conductive layers are parts of transistors. Among the plurality of transistors, those located at the portions intersecting the conductive layers 322 function as the source-side select transistors ST2 and ST3. Among the plurality of transistors, those located at portions intersecting the conductive layers 323 function as memory cell transistors MT (MT0 to MT7). Among the plurality of transistors, the one at the portion intersecting the conductive layers 324 functions as the drain-side select transistor ST1.

Each memory pillar MP includes a semiconductor film 330 and a ferroelectric film 331. The semiconductor film 330 is formed, for example, in a columnar shape extending in the z direction. The ferroelectric film 331 is a film made of a ferroelectric material and covers the outer peripheral surface of the semiconductor film 330.

Figure 5:
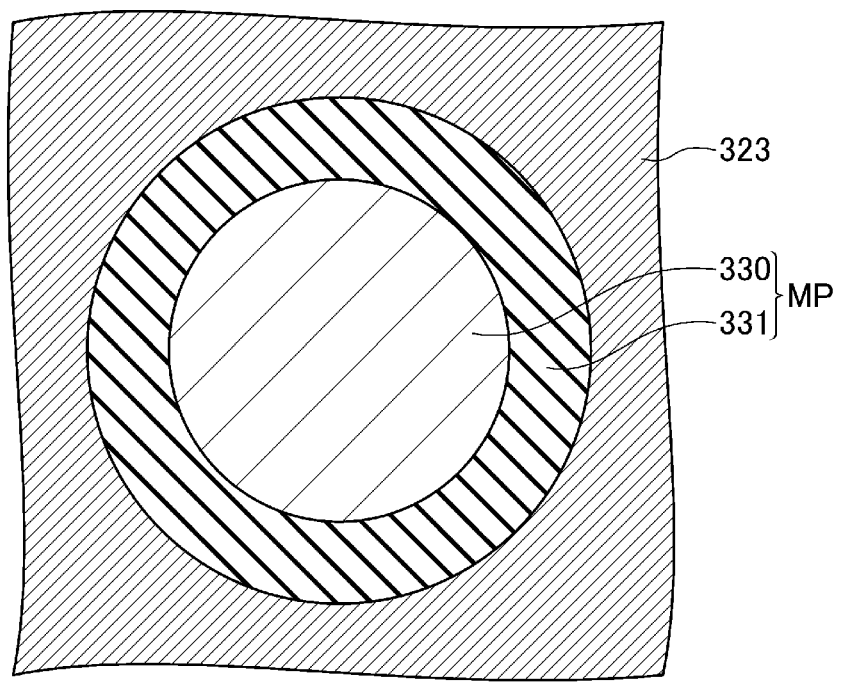
FIG. 5 is a cross-sectional view illustrating a cross-sectional structure taken along line V-V of FIG. 4.

FIG. 5 is a view illustrating a cross-sectional structure taken along line V-V in FIG. 4 and illustrates an example of the cross-sectional structure of the memory pillar MP in a layer including the conductive layer 323.

As illustrated in FIG. 5, in the layer including the conductive layer 323, the semiconductor film 330 is provided, for example, in the central portion of the memory pillar MP. The ferroelectric film 331 covers the entire outer peripheral surface of the semiconductor film 330. The conductive layer 323 functioning as a word line WL covers the entire outer peripheral surface of the ferroelectric film 331. It is noted that an insulating film may be buried in a central part of the semiconductor film 330.

As illustrated in FIG. 4, the lower end of the semiconductor film 330 provided in the memory pillar MP is in contact with the P-type well region 320. The upper portion of the semiconductor film 330 is in contact with the conductive layer 325. It is noted that the upper portion of the semiconductor film 330 and the conductive layer 325 may be electrically connected through a contact, a wiring, or the like.

The semiconductor film 330 is made of, for example, undoped poly silicon. The semiconductor film 330 is a portion functioning as a channel of the memory string MS. The ferroelectric film 331 is made of a ferroelectric material such as hafnium oxide ($HfO_2$). The ferroelectric film 331 functions as a block insulating film of the transistor. The ferroelectric film 331 changes the direction and magnitude of the spontaneous polarization according to the magnitude of the voltage applied to the conductive layer 323 (that is, word line WL). The data is stored in the memory cell transistor MT by utilizing such polarization reversal.

The conductive layer 326 is located, for example, in a wiring layer between the uppermost conductive layer 324 and the conductive layer 325, and is used as a CELSRC. The CELSRC is used as a wiring for changing the voltage of the P-type well region 320. The conductive layer 326 is electrically connected to the n+ impurity diffusion region NP via the contact 327.

The conductive layer 328 is located, for example, in a wiring layer between the uppermost conductive layer 324 and the conductive layer 325 and is used as a CPWELL. The CPWELL is used as a wiring for changing the voltage of the P-type well region 320. The conductive layer 328 is electrically connected to the p+ impurity diffusion region PP via the contact 329.

The lowermost conductive layer 322 and the insulator layer 321 extend to the vicinity of the n+ impurity diffusion region NP. Accordingly, when the source-side select transistor ST3 is turned on, the memory cell transistor MT0 and the n+ impurity diffusion region NP are electrically connected by the channel formed near the upper surface of the P-type well region 320.

1.5 Configuration of Sense Amplifier

Figure 6:
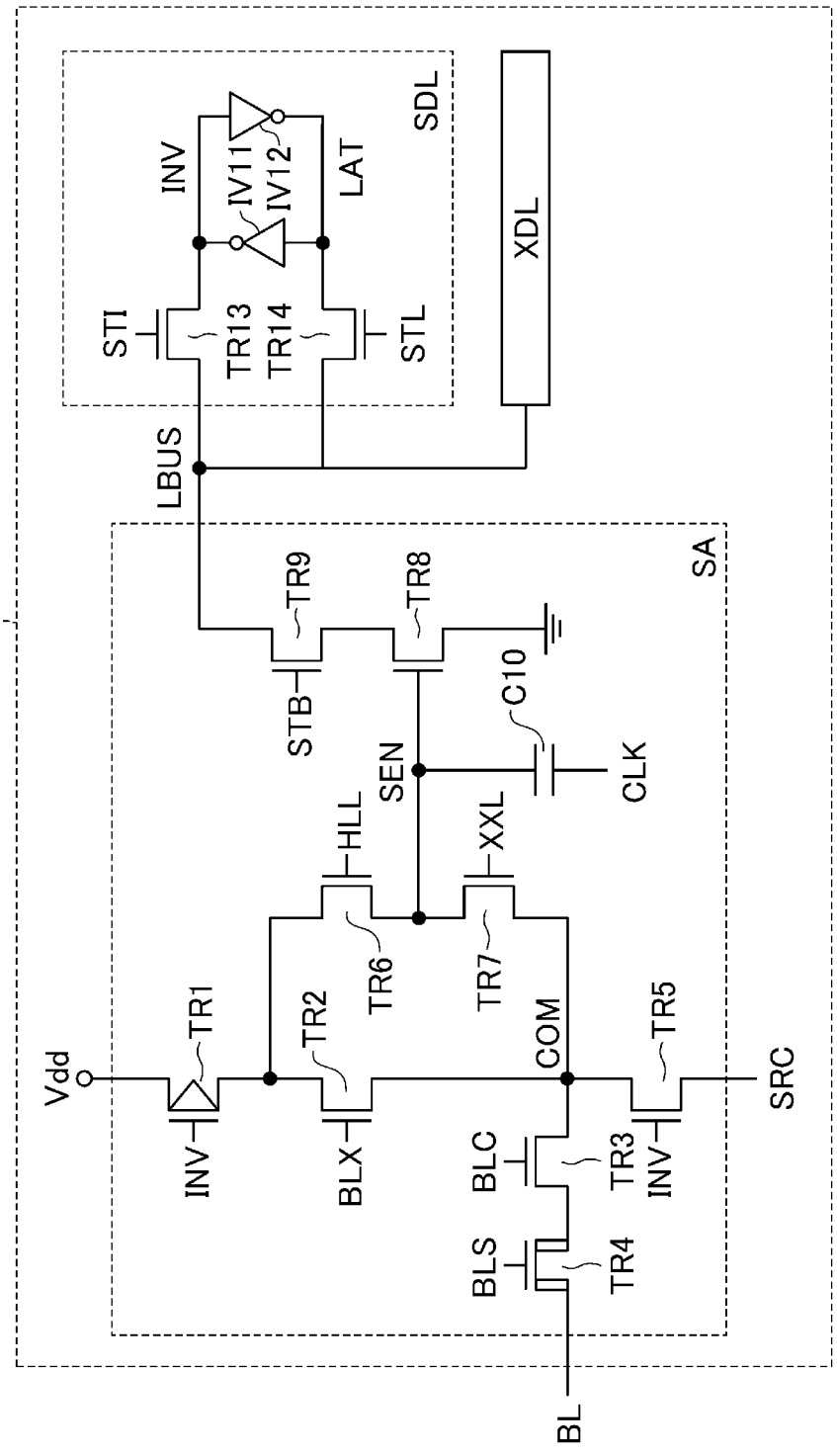
FIG. 6 is a circuit diagram illustrating a circuit configuration of a sense amplifier unit according to the first embodiment.

FIG. 6 illustrates a configuration example of the sense amplifier 120. The sense amplifier 120 includes a plurality of sense amplifier units SAU respectively associated with a plurality of the bit lines BL. FIG. 6 illustrates a detailed circuit configuration of one of the sense amplifier units SAU.

As illustrated in FIG. 6, the sense amplifier unit SAU includes a sense amplifier circuit SA and latch circuits SDL and XDL. The sense amplifier circuit SA and the latch circuits SDL and XDL are connected via a bus LBUS so that data can be transmitted and received by each other.

For example, in a read operation, the sense amplifier circuit SA senses data read to the corresponding bit line BL and determines whether the read data is "0" or "1". The sense amplifier circuit SA includes, for example, a transistor TR1 which is a p-channel MOS transistor, transistors TR2 to TR9 which are n-channel MOS transistors, and a capacitor C10.

One end of the transistor TR1 is connected to a power supply line, and the other end of the transistor TR1 is connected to the transistor TR2. A gate of the transistor TR1 is connected to a node INV in the latch circuit SDL. One end of the transistor TR2 is connected to the transistor TR1, and the other end of the transistor TR2 is connected to the node COM. A signal BLX is input to the gate of the transistor TR2. One end of the transistor TR3 is connected to the node COM, and the other end of the transistor TR3 is connected to the transistor TR4. A signal BLC is input to the gate of the transistor TR3. The transistor TR4 is a high voltage MOS transistor. One end of the transistor TR4 is connected to the transistor TR3. The other end of the transistor TR4 is connected to the corresponding bit line BL. A signal BLS is input to the gate of the transistor TR4.

One end of the transistor TR5 is connected to the node COM, and the other end of the transistor TR5 is connected to a node SRC. The gate of the transistor TR5 is connected to the node INV. One end of the transistor TR6 is connected between the transistors TR1 and TR2, and the other end of the transistor TR6 is connected to a node SEN. A signal HLL is input to the gate of the transistor TR6. One end of the transistor TR7 is connected to the node SEN, and the other end of the transistor TR7 is connected to a node COM. A signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

The signals BLX, BLC, BLS, HLL, XXL, and STB are generated by, for example, the sequencer 41. For example, Vdd which is an internal power supply voltage of the semiconductor memory device 2 is applied to the power supply line connected to one end of the transistor TR1, and for example, Vss which is the ground voltage of the semiconductor memory device 2 is applied to the node SRC. The internal power supply voltage Vdd is, for example, 1.5 V, and the ground voltage Vss is, for example, 0 V.

The latch circuits SDL and XDL temporarily store read data. The latch circuit XDL is connected to the input/output circuit 21 and used for inputting and outputting data between the sense amplifier unit SAU and the input/output circuit 21.

The latch circuit SDL includes, for example, inverters IV11 and IV12 and transistors TR13 and TR14 which are n-channel MOS transistors. The input node of the inverter IV11 is connected to a node LAT. The output node of the inverter IV11 is connected to the node INV. The input node of the inverter IV12 is connected to the node INV. The output node of the inverter IV12 is connected to the node LAT. One end of the transistor TR13 is connected to the node INV, and the other end of the transistor TR13 is connected to the bus LBUS. A signal STI is input to the gate of the transistor TR13. One end of the transistor TR14 is connected to the node LAT, and the other end of the transistor TR14 is connected to the bus LBUS. A signal STL is input to the gate of the transistor TR14. For example, the data stored at the node LAT corresponds to the data stored in the latch circuit SDL. In addition, the data stored at the node INV corresponds to the inverted data of the data stored at the node LAT. Since a circuit configuration of the latch circuit XDL is the same as that of the latch circuit SDL, for example, description thereof will be omitted.

1.6 Configuration of Memory Cell Transistors

In the semiconductor memory device 2 according to this embodiment, the memory cell transistor MT is a so-called ferroelectric field-effect transistor (FeFET) storing data by spontaneous polarization of the ferroelectric film 331.

Figure 7:
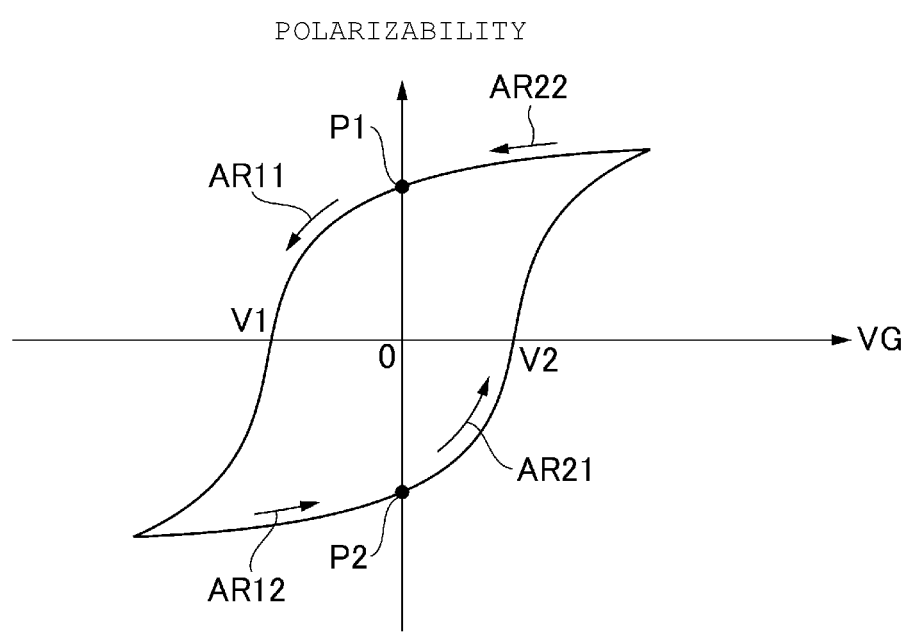
FIG. 7 is a graph illustrating a relationship between applied voltages and polarizability of a memory cell transistor according to the first embodiment.

Characteristics of the memory cell transistor MT will be described with reference to FIGS. 7 and 8. FIG. 7 is a diagram illustrating a relationship between the applied voltage and the polarizability in the memory cell transistor MT. VG illustrated on the horizontal axis of FIG. 7 is the voltage applied between the channel (semiconductor film 330) of the memory cell transistor MT and the word line WL (conductor layer 323). The vertical axis in FIG. 7 is the polarizability of the ferroelectric film 331. FIGS. 8A and 8B are cross-sectional views schematically illustrating the state of the memory cell transistor MT, specifically, the state of the spontaneous polarization of the ferroelectric film 331 and the like.

In the state indicated by P1 in FIG. 7, the voltage applied to the memory cell transistor MT is 0 V, and the ferroelectric film 331 is spontaneously polarized in the positive direction. FIG. 8A illustrates the state of the memory cell transistor MT at P1. In this state, positive charges are induced on the surface of the ferroelectric film 331 on the semiconductor film 330 side. On the surface of the semiconductor film 330 on the ferroelectric film 331 side, a state where the channels are connected as indicated by reference numeral "330A" by an electric field from the ferroelectric film 331 occurs. Accordingly, the memory cell transistor MT is turned on.

When the applied voltage is increased from the state indicated by P1 to the negative side (that is, when the voltage applied to the word line WL is lowered), the polarizability of the ferroelectric film 331 changes in the direction of an arrow AR11 along the hysteresis in FIG. 7. When the applied voltage reaches V1, polarization reversal occurs, and the polarizability of the ferroelectric film 331 is in a state of being reversed in the negative direction. After that, after passing the voltage value at which the absolute value of the polarizability reaches the maximum point, when the applied voltage is changed to the positive side (that is, when the voltage applied to the word line WL is increased), the absolute value of the polarizability of the ferroelectric film 331 is slightly decreased in the direction of an arrow AR12 along the hysteresis in FIG. 7. When the applied voltage becomes 0 V, the state illustrated by P2 is obtained, and the polarization state of P2 is maintained even in a state where the voltage from the outside is 0 V.

In the state indicated by P2, the voltage applied to the memory cell transistor MT is 0 V, and the ferroelectric film 331 is spontaneously polarized in the negative direction. That is, as described above, the polarization reversal occurs from the state indicated by P1. FIG. 8B illustrates the state of the memory cell transistor MT at P2. In this state, negative charges are induced on the surface of the ferroelectric film 331 on the semiconductor film 330 side. On the surface of the semiconductor film 330 on the ferroelectric film 331 side, the channel is cut off by the electric field from the ferroelectric film 331. Accordingly, the memory cell transistor MT is turned off.

When the applied voltage is increased from the state indicated by P2 to the positive side (that is, when the voltage applied to the word line WL is further increased), the polarizability of the ferroelectric film 331 is changed in the direction of an arrow AR21 along the hysteresis in FIG. 7. When the applied voltage becomes V2, the polarization reversal occurs again, and the polarizability of the ferroelectric film 331 is in a state of being reversed in the positive direction. After that, after passing the voltage value at which the absolute value of the polarizability reaches the maximum point, when the applied voltage is changed to the negative side (that is, when the voltage applied to the word line WL is lowered), the absolute value of the polarizability of the ferroelectric film 331 is slightly decreased in the direction of an arrow AR22 along the hysteresis in FIG. 7. When the applied voltage becomes 0 V, the state is returned to the state illustrated by P1, and the polarization state of P1 is maintained even in a state where the voltage from the outside is 0 V.

Figure 8A:
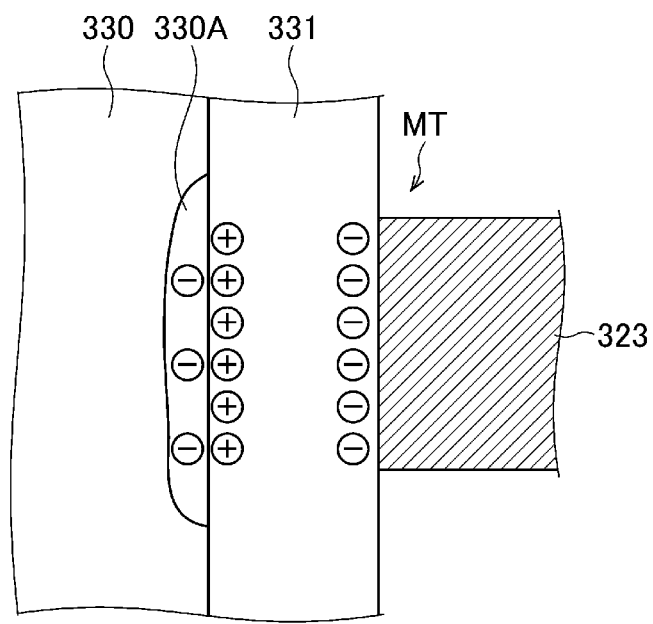
FIGS. 8A and 8B are diagrams schematically illustrating polarization states of the memory cell transistor according to the first embodiment.
Figure 8B:
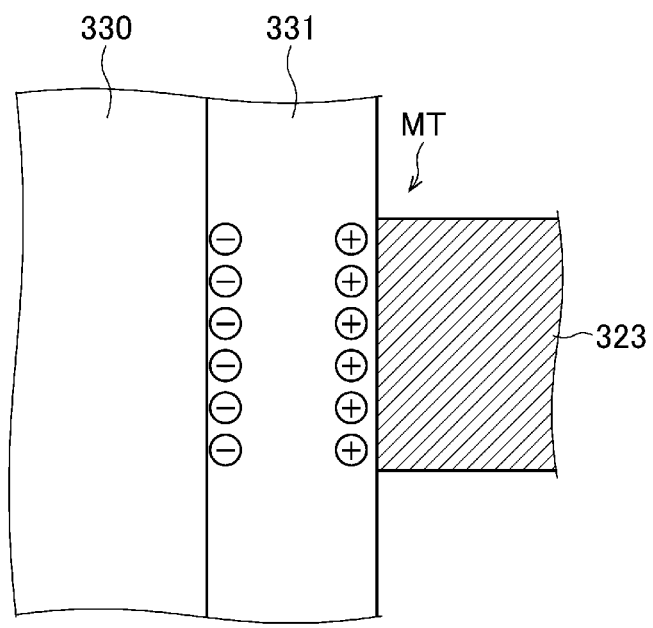

As described above, in the memory cell transistor MT, by changing the voltage applied via the word line WL, the state where the ferroelectric film 331 is spontaneously polarized in the positive direction as illustrated in FIG. 8A and the state where the ferroelectric film 331 is spontaneously polarized in the negative direction as illustrated in FIG. 8B can be alternately switched.

As illustrated in FIG. 8A, in a state where the ferroelectric film 331 is spontaneously polarized in the positive direction, when the applied voltage is changed in the negative direction (that is, when the voltage applied to the word line WL is lowered), the channel is in a state of being cut off in the middle, and the memory cell transistor MT is turned off. That is, in a state where the ferroelectric film 331 is spontaneously polarized in the positive direction, a threshold voltage Vth of the memory cell transistor MT becomes a negative value.

On the other hand, in a state where the ferroelectric film 331 is spontaneously polarized in the negative direction as illustrated in FIG. 8B, when the applied voltage is changed in the positive direction (that is, when the voltage applied to the word line WL is increased), the channel is in a state of being connected in the middle, and the memory cell transistor MT is turned on. That is, in a state where the ferroelectric film 331 is spontaneously polarized in the positive direction, the threshold voltage of the memory cell transistor MT becomes a positive value.

As described above, the memory cell transistor MT of this embodiment is configured such that the direction of the spontaneous polarization is changed according to the applied voltage between the word line WL and the channel, and the threshold voltage is also changed accordingly. Specifically, the memory cell transistor MT has a configuration in which, when a voltage is applied such that the voltage of the word line WL is higher than the voltage of the channel and exceeds the voltage that causes the polarization reversal to occur, the threshold voltage is lowered, and when a voltage is applied such that the voltage of the word line WL is lower than the voltage of the channel and exceeds the voltage that causes the polarization reversal to occur, the threshold voltage is raised.

Figure 9A:
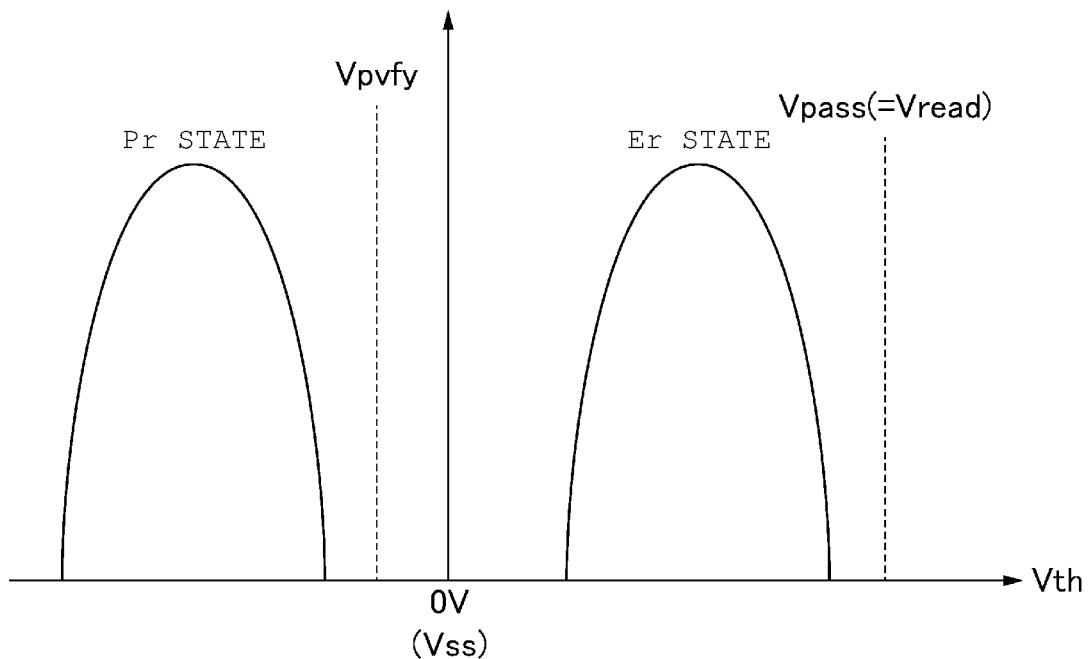
FIGS. 9A and 9B are graphs respectively illustrating a probability on the vertical axis, that the memory cell transistor according to the first embodiment has threshold voltages shown on the horizontal axis.

FIG. 9A illustrates a correspondence relationship between the threshold voltage Vth (horizontal axis) and the probability that a memory cell transistor MT (vertical axis) has the threshold voltage Vth of the horizontal axis. When an SLC (Single Level Cell) method is adopted as the storage method of the memory cell transistors MT, the threshold voltages of the plurality of memory cell transistors MT form two distributions as illustrated in FIG. 9A. These two threshold voltage distributions (corresponding to write states) are referred to as a Pr state and an Er state in ascending order of the threshold voltages.

The Pr state is the distribution of the threshold voltage Vth when the ferroelectric film 331 is spontaneously polarized in the positive direction as illustrated in FIG. 8A. The Pr state is a state in which data is written, and for example, the data of "0" is assigned.

The Er state corresponds to the distribution of the threshold voltage Vth when the ferroelectric film 331 is spontaneously polarized in the negative direction as illustrated in FIG. 8B. The Er state is a state in which data is erased, and for example, the data of "1" is assigned. When the erasing operation is performed, the threshold voltage distribution of the memory cell transistors MT changes from the Pr state to the Er state.

1.7 Write Operation

In the semiconductor memory device 2 of this embodiment, when among the plurality of bit lines BL0 to BL(m−1) illustrated in FIG. 3, the bit lines BL0, BL2, BL4, . . . are set as even-numbered bit lines and the bit lines BL1, BL3, BL5, . . . are set as odd-numbered bit lines, the read operation and the write operation are executed as divided into the even-numbered bit lines and the odd-numbered bit lines. In the following, the case of performing the writing to the memory cell transistors MT corresponding to the bit lines BL2 and BL4 will be described as an example.

Figure 10:
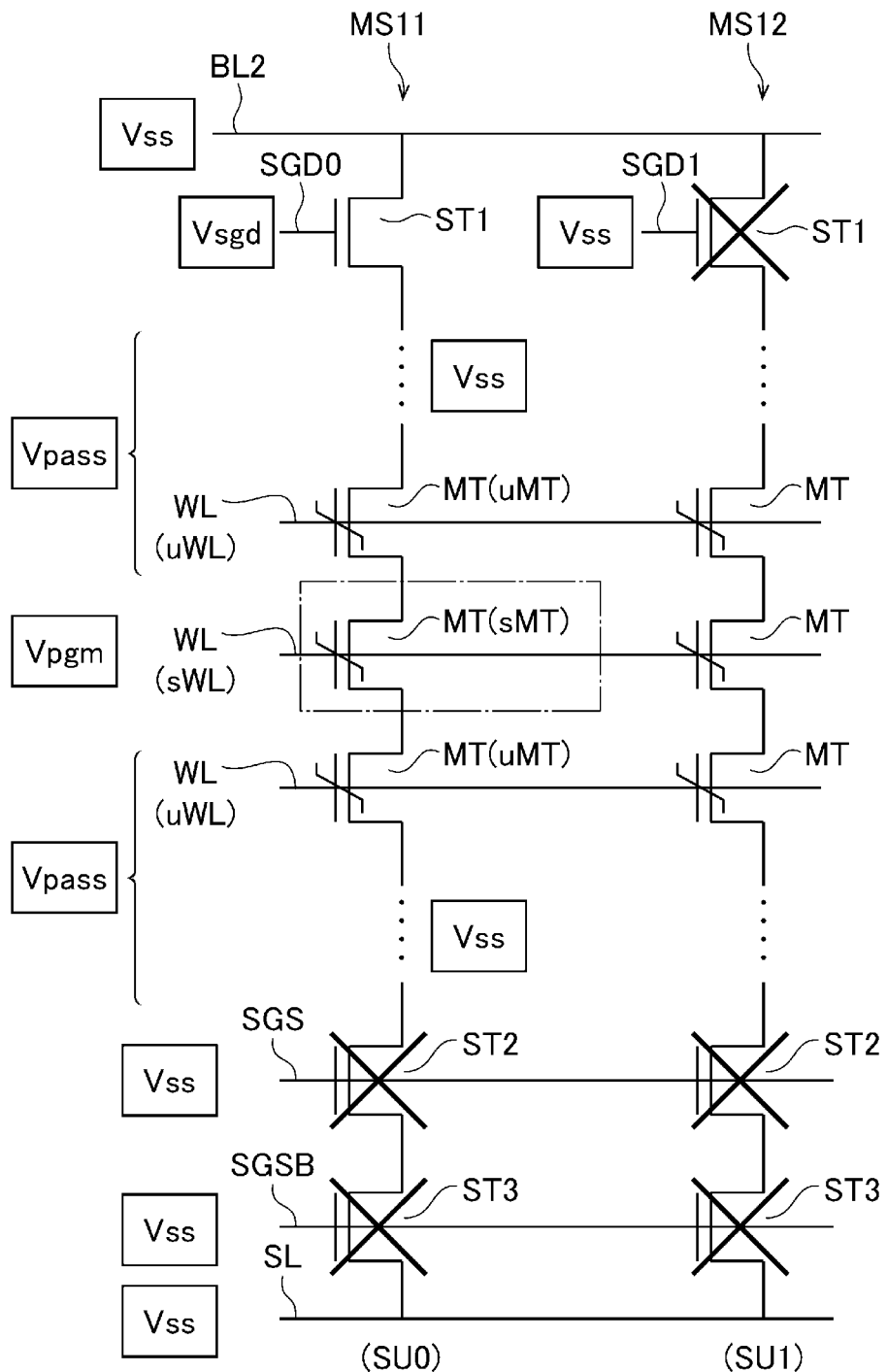
FIGS. 10-11 are diagrams schematically illustrating operation examples of the memory cell array in a first program operation according to the first embodiment.
Figure 11:
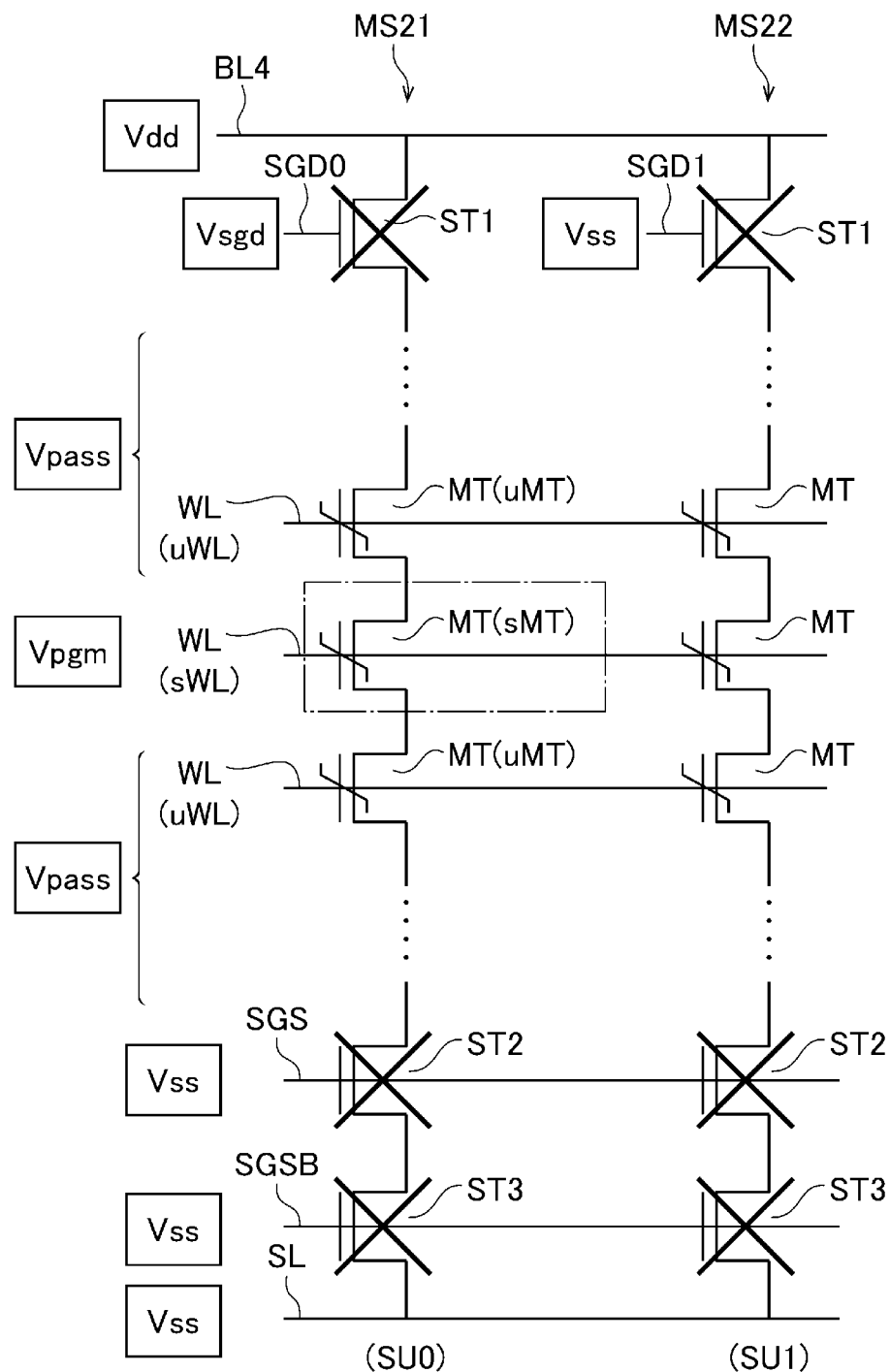

FIGS. 10 and 12 to 16 are views illustrating simplifications of the memory strings MS11 and MS12 corresponding to the bit line BL2. FIG. 11 is a simplified representation of the memory strings MS21 and MS22 corresponding to the bit line BL4. In FIGS. 10 to 16, among the transistors ST1, ST2, and ST3, those that are in the off state are marked with a cross. Characters such as "Vss", "Vsgd", "Vpass", and "Vpgm" surrounded by rectangular frames in FIGS. 10 to 16 represent the voltage of each component. FIGS. 10 to 16 illustrate the voltages of each component when the write operation is performed. The process of adjusting the voltage of each component illustrated in FIGS. 10 to 16 is realized by allowing the sequencer 41 to control the sense amplifier 120, the row decoder 130, the voltage generation circuit 43, and the like.

The write operation in this embodiment is selectively performed on a specific page. In FIGS. 10 to 16, the memory cell transistor MT that is a writing target is surrounded by a one-dot dashed line. That is, FIGS. 10 to 16 illustrate the case where the string unit SU0 is selected as a target of the write operation and the string unit SU1 is not selected as a target of the write operation.

Hereinafter, the string unit SU0 selected as a target of the write operation is referred to as the "selected string unit SU0", and the string unit SU1 not selected as a target of the write operation is referred to as the "non-selected string unit SU1". In addition, in the selected string unit SU0, the memory cell transistor MT that is a writing target is referred to as a "selected memory cell transistor sMT", and the word line WL connected to the selected memory cell transistor sMT is also referred to as a "selected word line sWL". In this embodiment, the selected word line sWL corresponds to the first word line. In addition, in the selected string unit SU0, the memory cell transistors other than the selected memory cell transistor sMT are referred to as "non-selected memory cell transistors uMT", and the word lines WL connected to the non-selected memory cell transistors uMT are also referred to as "non-selected word lines uWL". In this embodiment, the selected memory cell transistor sMT corresponds to the first memory cell transistor.

It is noted that the selected memory cell transistor sMT also includes memory cell transistors MT of other memory strings MS belonging to the string unit SU0 in addition to those illustrated in FIGS. 10 to 16.

FIGS. 17A to 17J are timing charts illustrating voltage transitions of various components of the memory cell array 110 when such a write operation is performed. In FIGS. 17A to 17J, "SGD0" indicates a transition in voltage on the gate line SGD0, and "SGD1" indicates a transition in voltage on the gate line SGD1. "sWL" indicates a transition in voltage on the selected word line sWL, and "uWL" indicates a transition in voltage on the non-selected word line uWL. "SGS and SGSB" indicate a transition in voltage on the gate lines SGS and SGSB, and "SEN" indicates a transition in voltage on the node SEN of the sense amplifier circuit SA. "BL2" indicates a transition in voltage on the bit line BL2, and "BL4" indicates a transition in voltage on the bit line BL4. "BL1, BL3, and BL5" indicate a transition in voltage on the bit lines BL1, BL3, and BL5, and "SL" indicates a transition in voltage on the source line SL.

FIGS. 18A to 18E are timing charts illustrating transitions of the signals BLC, BLX, HLL, XXL, and STB applied to the sense amplifier 120 when the above write operation is performed.

As illustrated in FIGS. 17A to 17J and FIGS. 18A to 18E, in the write operation of this embodiment, the first program operation and the second program operation are performed in this order. The first program operation is an operation of writing data to the memory cell array 110. In this embodiment, the first program operation corresponds to a first pulse application operation. The second program operation is an operation of rewriting data when the data cannot be written sufficiently by the first program operation. The second program operation may be repeated.

1.7.1 First Program Operation

In FIGS. 17A to 17J and FIGS. 18A to 18E, the time when the write operation is started, in other words, the time when the first program operation is started is indicated by "t10". As illustrated in FIGS. 17A to 17J, the ground voltage Vss is applied to each part of the memory cell array 110 at a time before time t10. In addition, as illustrated in FIGS. 18A to 18E, each signal applied to the sense amplifier 120 is set to a low level.

When the first program operation is started at time t10, the write data is transferred from the input/output circuit 21 illustrated in FIG. 2 to the sense amplifier 120. Accordingly, the data of "1" or the data of "0" is stored in the latch circuit SDL of the sense amplifier 120 illustrated in FIG. 6. When the data of "0" is stored in the latch circuit SDL, the node LAT is set to a low level and the node INV is set to a high level. Therefore, the transistor TR1 is turned off, and the transistor TR5 is turned on. Meanwhile, when the data of "1" is stored in the latch circuit SDL, the node LAT is set to a high level, and the node INV is set to a low level. Therefore, the transistor TR1 is turned on, and the transistor TR5 is turned off.

As illustrated in FIGS. 18A and 18B, when the first program operation is started at time t10, the signals BLC and BLX are set to a high level. For this reason, the transistors TR2 and TR3 illustrated in FIG. 6 are turned on. At this time, when the data of "0" is stored in the latch circuit SDL, since the transistor TR1 is turned off and the transistor TR5 is turned on as described above, the transistor TR4 is turned on, so that the voltage applied to the node SRC, that is, the ground voltage Vss is applied to the bit line BL. Therefore, for example, when writing the data of "0" to the selected memory cell transistor sMT corresponding to the bit line BL2, the ground voltage Vss is applied to the bit line BL2 as illustrated in FIGS. 10 and 17G. In this embodiment, the ground voltage Vss applied to the bit line BL2 in the first program operation corresponds to the second voltage.

Meanwhile, when the data of "1" is stored in the latch circuit SDL illustrated in FIG. 6, since the transistor TR1 is turned on and the transistor TR5 is turned off as described above, the transistor TR4 is turned on, so that the internal power supply voltage Vdd is applied to the bit line BL. Therefore, for example, when writing the data of "1" to the selected memory cell transistor sMT corresponding to the bit line BL4, the internal power supply voltage Vdd is applied to the bit line BL4 as illustrated in FIGS. 11 and 17H.

As illustrated in FIG. 17E, when the first program operation is started at time t10, the gate lines SGS and SGSB are maintained to be in a state where the ground voltage Vss is applied. Accordingly, as illustrated in FIGS. 10 and 11, the respective source-side select transistors ST2 and ST3 of the selected string unit SU0 and the non-selected string unit SU1 are maintained to be in the off state.

Meanwhile, as illustrated in FIG. 17A, when the first program operation is started at time t10, the voltage of the gate line SGD0 of the selected string unit SU0 is raised up to the voltage Vsgd. The voltage Vsgd can turn on the drain-side select transistor ST1 when the ground voltage Vss is applied to the bit line BL, and the voltage Vsgd can turn off the drain-side select transistor ST1 when the internal power supply voltage Vdd is applied to the bit line BL, and the voltage Vsgd is, for example, 1.5 V. Accordingly, as illustrated in FIG. 10, the drain-side select transistor ST1 of the selected string unit SU0 corresponding to the bit line BL2 is turned on. In contrast, as illustrated in FIG. 11, the drain-side select transistor ST1 of the selected string unit SU0 corresponding to the bit line BL4 is turned off. As a result, the channel of the memory string MS21 of the selected string unit SU0 is in a floating state.

In addition, as illustrated in FIG. 17B, when the first program operation is started at time t10, the gate line SGD1 of the non-selected string unit SU1 is maintained to be in a state where the ground voltage Vss is applied. Accordingly, as illustrated in FIGS. 10 and 11, since the drain-side select transistor ST1 of the non-selected string unit SU1 is maintained to be in the off state, the channel of each of the memory strings MS12 and MS22 of the non-selected string unit SU1 are in a floating state.

As illustrated in FIGS. 17C and 17D, when the first program operation is started at time t10, the voltage of each of the selected word line sWL and the non-selected word lines uWL is raised up to a pass voltage Vpass. The pass voltage Vpass is set to a value as illustrated in FIG. 9A, and specifically, is set to a voltage high enough to turn on the memory cell transistor MT and low enough to prevent writing, and the pass voltage Vpass is set to, for example, 3 V. As illustrated in FIG. 9A, the pass voltage Vpass is set to a voltage higher than a maximum threshold voltage at the Er state of the memory cell transistor MT. Therefore, when the pass voltage Vpass is applied to the gate of the memory cell transistor MT, the memory cell transistor MT is turned on regardless of the stored data.

When the pass voltage Vpass is applied to the selected word line sWL and the non-selected word lines uWL, in the memory string MS11 of the selected string unit SU0, the selected memory cell transistor sMT and the non-selected memory cell transistor uMT are turned on to such an extent that the writing is not performed. For this reason, as illustrated in FIG. 10, the ground voltage Vss is applied from the bit line BL2 to the channel of the memory string MS11 of the selected string unit SU0 via the drain-side select transistor ST1 that is turned on.

Subsequently, as illustrated in FIG. 17C, the voltage of the selected word line sWL is further raised up to the program voltage Vpgm at time t11. The program voltage Vpgm is a high voltage that turns on the memory cell transistor MT and writes to the memory cell transistor MT and is set to, for example, 6 V. In this embodiment, the program voltage Vpgm applied to the selected word line sWL in the first program operation corresponds to the first voltage. When the program voltage Vpgm is applied to the selected word line sWL, the ferroelectric film 331 of the selected memory cell transistor sMT provided in the memory string MS11 of the selected string unit SU0 is spontaneously polarized based on a voltage difference between the ground voltage Vss applied to the channel of the memory string MS11 and the program voltage Vpgm applied to the selected word line sWL. That is, the threshold voltage Vth of the selected memory cell transistor sMT is lowered to the Pr state illustrated in FIG. 9A to transition to the state in which the data of "0" is stored in the selected memory cell transistor sMT. On the other hand, as illustrated in FIG. 11, since the channel of the memory string MS21 of the selected string unit SU0 is in the floating state, even when the program voltage Vpgm is applied to the selected word line sWL, the ferroelectric film 331 of the selected memory cell transistor sMT of the memory string MS21 is not spontaneously polarized. That is, the threshold voltage Vth of the selected memory cell transistor sMT of the memory string MS21 is maintained at the Er state illustrated in FIG. 9A, so that the state in which the data of "1" is stored is maintained. It is noted that, as illustrated in FIGS. 10 and 11, since the channel of each of the memory strings MS12 and MS22 of the non-selected string unit SU1 is in the floating state, even when the program voltage Vpgm is applied to the selected word line sWL, the writing to the memory cell transistor MT corresponding to the selected word line sWL is not performed.

As illustrated in FIG. 17C, the voltage of the selected word line sWL is lowered from the program voltage Vpgm to the ground voltage Vss at time t12. In addition, as illustrated in FIGS. 18A and 18B, each of the signals BLC and BLX of the sense amplifier 120 is set to a low level at time t12. After that, each of the signals BLC, BLX, HLL, XXL, and STB of the sense amplifier 120 is maintained at a low level. Therefore, in the sense amplifier 120 illustrated in FIG. 6, both transistors TR2 and TR3 are maintained to be in the off state. That is, the bit line BL2 is maintained to be in a state where the bit line is not connected to the node SRC and the internal power supply voltage Vdd is not applied. In addition, as illustrated in FIG. 17F, the voltage of the node SEN is maintained at the ground voltage Vss.

It is noted that, as illustrated in FIG. 17I, when the first program operation is started at time t10, the state where the voltages of the odd-numbered bit lines including the bit lines BL1 and BL3 arranged on both sides of the bit line BL2 are raised up to the internal power supply voltage Vdd is maintained. Accordingly, the voltage fluctuation of the odd-numbered bit lines is avoided from affecting the voltage of the even-numbered bit lines. In this embodiment, the internal power supply voltage Vdd applied to the odd-numbered bit lines corresponds to a predetermined voltage.

Figure 9B:
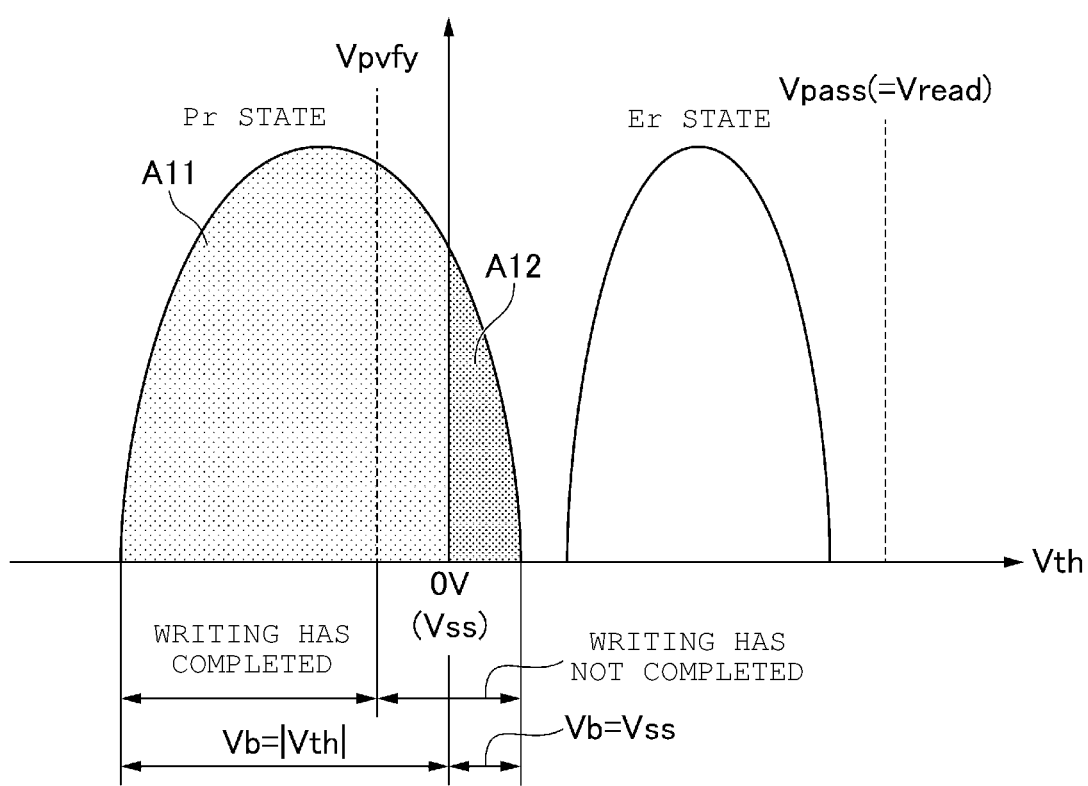

Moreover, when writing the data of "0" to the selected memory cell transistor sMT provided in the memory string MS11 of the selected string unit SU0 in this manner, due to the individual difference, or the like, the variation as illustrated in FIG. 9B may be present in the threshold voltage Vth of the selected memory cell transistor sMT after performing the write operation. In this embodiment, when the threshold voltage Vth of the selected memory cell transistor sMT after performing the write operation is lower than a verify voltage Vpvfy illustrated in FIG. 9B, it is determined that the writing to the selected memory cell transistor sMT has completed, and on the other hand, when the threshold voltage Vth of the selected memory cell transistor sMT is the verify voltage Vpvfy or more, it is determined that the writing to the selected memory cell transistor sMT has not completed. In this embodiment, the verify voltage Vpvfy corresponds to a writing determination voltage.

In addition, in the present embodiment, as described above, following the first program operation, the second program operation of rewriting data to the selected memory cell transistor sMT for which the writing has not completed is performed. Specifically, in the second program operation, when the threshold voltage Vth of the selected memory cell transistor sMT after the writing is equal to or more than the verify voltage Vpvfy illustrated in FIG. 9B, the writing the data to the selected memory cell transistor sMT is performed again. By performing the second program operation once or multiple times, the distribution of the threshold voltage Vth of the selected memory cell transistor sMT can be shifted to the distribution illustrated in FIG. 9A, that is, the distribution of the threshold voltage Vth that is lower than the verify voltage Vpvfy.

1.7.2 Second Program Operation

As illustrated in FIGS. 17A to 17J, in the second program operation, the precharge operation, and the pulse application operation are performed in this order. The precharge operation is an operation of applying a voltage required for writing data again to the bit line BL. The pulse application operation is an operation of rewriting data to the selected memory cell transistor sMT by using the voltage applied to the bit line BL. In this embodiment, the pulse application operation of the second program operation corresponds to the second pulse application operation.

1.7.2.1 Precharge Operation of Second Program Operation

In FIGS. 17A to 17J and FIGS. 18A to 18E, the time when the second program operation is started, in other words, the time when the precharge operation is started is indicated by "t13".

When the precharge operation is started at time t13, as illustrated in FIG. 17C, the ground voltage Vss is applied to the selected word line sWL. In this embodiment, the ground voltage Vss applied to the selected word line sWL in the precharge operation corresponds to a third voltage. In addition, as illustrated in FIG. 17D, a read pass voltage Vread is applied to the non-selected word lines uWL. In this embodiment, the read pass voltage Vread is set to, for example 3 V and is set to the same value as the pass voltage Vpass as illustrated in FIG. 9B.

As illustrated in FIG. 17J, the voltage of the source line SL is raised up to the internal power supply voltage Vdd at time t13. In this embodiment, the internal power supply voltage Vdd applied to the source line SL in the precharge operation corresponds to the fourth voltage. In addition, as illustrated in FIG. 17A, the voltage of the gate line SGD0 of the selected string unit SU0 is raised up to the read pass voltage Vread at time t14, and as illustrated in FIG. 17E, the voltage of each of the gate lines SGS and SGSB is also raised up to the read pass voltage Vread at time t15.

Figure 12:
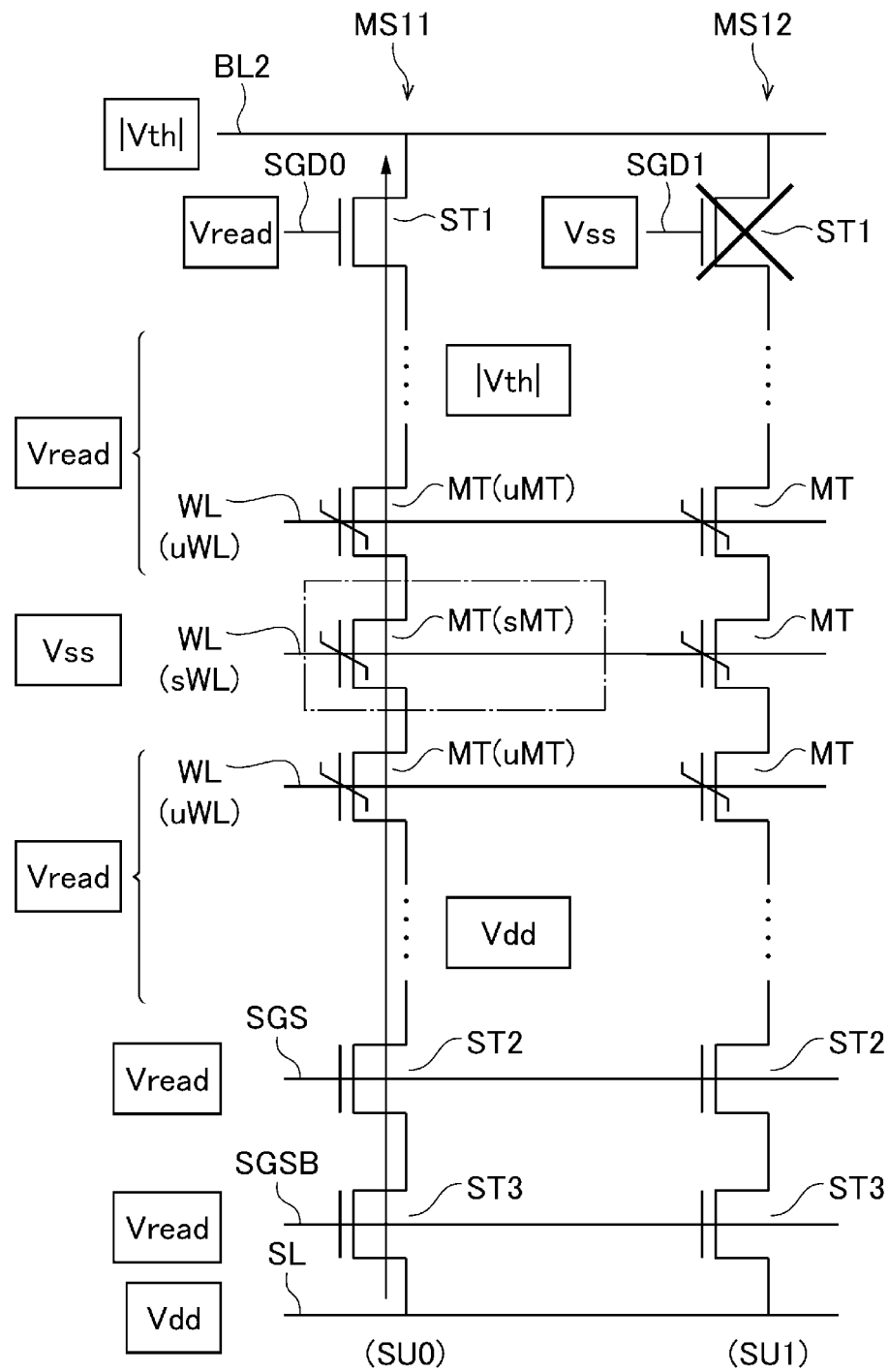
FIGS. 12-13 are diagrams schematically illustrating operation examples of the memory cell array in a precharge operation of a second program operation according to the first embodiment.

Accordingly, as illustrated in FIG. 12, in the memory string MS11 of the selected string unit SU0, the drain-side select transistor ST1, the source-side select transistors ST2 and ST3, and the plurality of non-selected memory cell transistors uMT are turned on. At this time, the voltage corresponding to the write state of the selected memory cell transistor sMT is applied to the bit line BL2 to charge the bit line.

Specifically, when the threshold voltage Vth of the selected memory cell transistor sMT belongs to the area A11 illustrated in FIG. 9B, that is, when the threshold voltage Vth of the selected memory cell transistor sMT is lower than the ground voltage Vss, the voltage of each component of the memory string MS11 is as illustrated in FIG. 12. As illustrated in FIG. 12, in the channel of the memory string MS11, the internal power supply voltage Vdd is applied from the source line SL via the source-side select transistors ST2 and ST3 to the portion of the channel located closer to the source line SL than the selected memory cell transistor sMT. Therefore, the internal power supply voltage Vdd is applied to the source of the selected memory cell transistor sMT. Since the ground voltage Vss is applied to the selected word line sWL in this state, when the threshold voltage Vth of the selected memory cell transistor sMT is lower than the ground voltage Vss, the selected memory cell transistor sMT is turned on. At this time, in the channel of the memory string MS11, a voltage corresponding to the polarizability P1 illustrated in FIG. 7, specifically, a voltage corresponding to the absolute value |Vth| of the threshold voltage of the selected memory cell transistor sMT is generated in the portion located closer to the bit line BL2 than the selected memory cell transistor sMT. This voltage |Vth| is applied to the bit line BL2 via the drain-side select transistor ST1. At this time, the bit line BL2 is not connected to any one of the node SRC and the internal power supply voltage Vdd. For this reason, the bit line BL2 is charged with the voltage |Vth|.

It is noted that when the writing to the selected memory cell transistor sMT has completed, since the threshold voltage Vth of the selected memory cell transistor sMT is lower than the verify voltage Vpvfy illustrated in FIG. 9B, a voltage higher than the absolute value |Vpvfy| of the verify voltage is applied to the bit line BL2 as illustrated by a solid line in FIG. 17G. On the other hand, when the writing to the selected memory cell transistor sMT has not completed, since the threshold voltage Vth of the selected memory cell transistor sMT satisfies "Vpvfy≤Vth<0", as indicated by the one-dot dashed line in FIG. 17G, a voltage that is the absolute value |Vpvfy| or less of the verify voltage and higher than the ground voltage Vss is applied to the bit line BL2.

Figure 13:
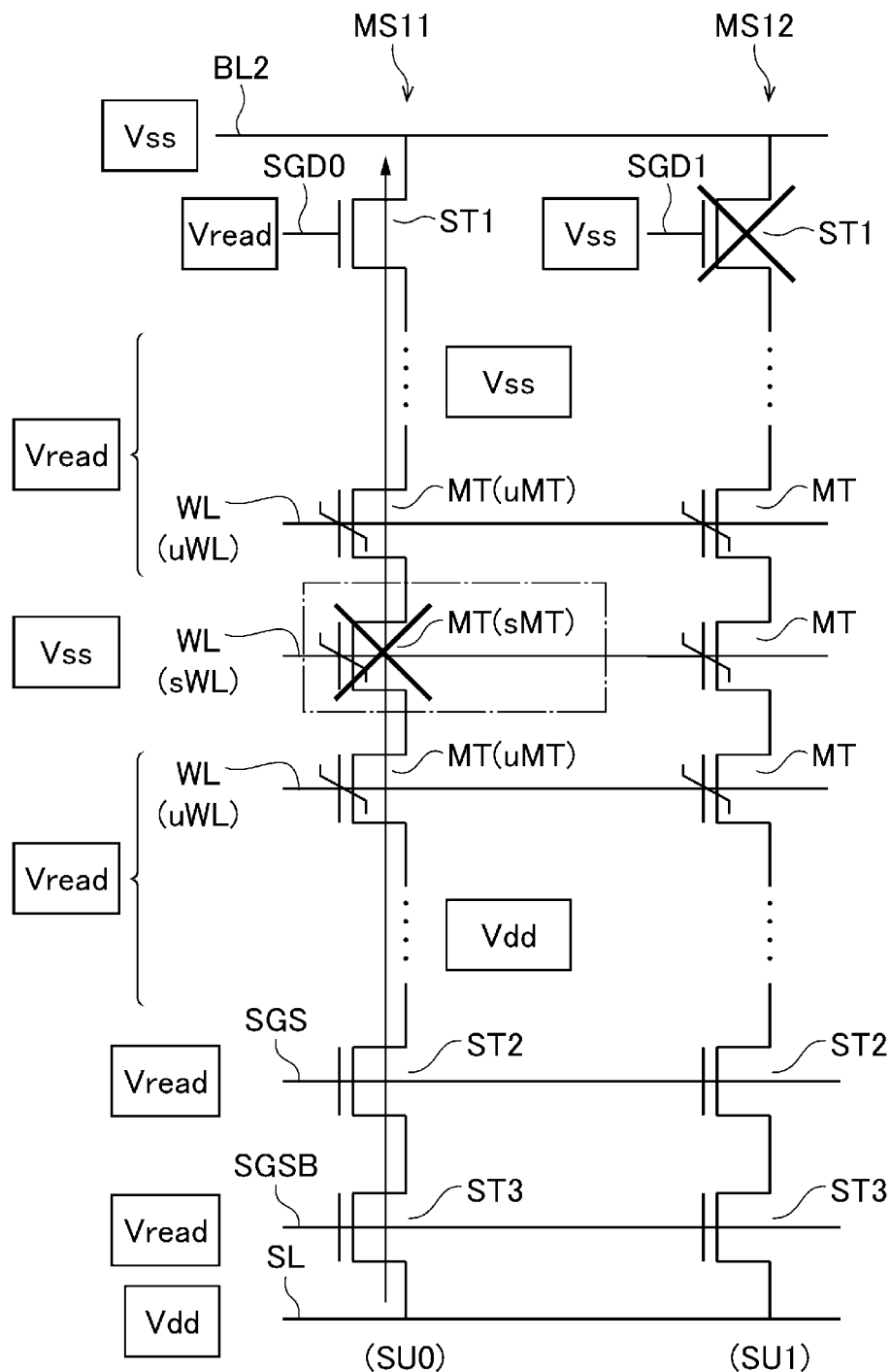

On the other hand, when the threshold voltage Vth of the selected memory cell transistor sMT belongs to an area A12 illustrated in FIG. 9B, that is, when the threshold voltage Vth of the selected memory cell transistor sMT is the ground voltage Vss or more, the voltage of each component of the memory string MS11 becomes as illustrated in FIG. 13. In this case, when the internal power supply voltage Vdd is applied to the source of the selected memory cell transistor sMT and the ground voltage Vss is applied to the selected word line sWL, the selected memory cell transistor sMT is turned off. For this reason, in the channel of the memory string MS11, each of the voltage of the portion located closer to the bit line BL2 than the selected memory cell transistor sMT and the voltage of the bit line BL2 are maintained. Specifically, as indicated by a broken line in FIG. 17G, the voltage of the bit line BL2 is maintained at the ground voltage Vss.

As described above, by performing the precharge operation, the charging voltage of the bit line BL2 is set as illustrated in FIG. 19 according to the threshold voltage Vth of the selected memory cell transistor sMT.

(a1) When the threshold voltage Vth of the selected memory cell transistor sMT satisfies "Vth<Vpvfy", that is, when the writing to the selected memory cell transistor sMT has completed, the charging voltage Vb of the bit line BL2 becomes the voltage |Vth|. At this time, the charging voltage Vb of the bit line BL2 satisfies "Vb>|Vpvfy|".

(a2) When the threshold voltage Vth of the selected memory cell transistor sMT satisfies "Vpvfy≤Vth<Vss", that is, when the writing to the selected memory cell transistor sMT has not completed, the charging voltage Vb of the bit line BL2 becomes the voltage |Vth|. At this time, the charging voltage Vb of the bit line BL2 satisfies "Vss<Vb|Vpvfy|".

(a3) When the threshold voltage Vth of the selected memory cell transistor sMT satisfies "Vss≤Vth", that is, when the writing to the selected memory cell transistor sMT has not completed, the charging voltage Vb of the bit line BL2 becomes the ground voltage Vss.

As illustrated in FIG. 17E, the voltages of the gate lines SGS and SGSB are lowered from the read pass voltage Vread to the ground voltage Vss at time t16. In addition, as illustrated in FIGS. 17A, 17D, and 17J, the gate line SGD0, the non-selected word lines uWL, and the source line SL are lowered to the ground voltage Vss at time t17.

1.7.2.2 Pulse Application Operation of Second Program Operation

In FIGS. 17A to 17J and FIGS. 18A to 18E, the time when the pulse application operation of the second program operation is started is indicated by "t18".

Figure 14:
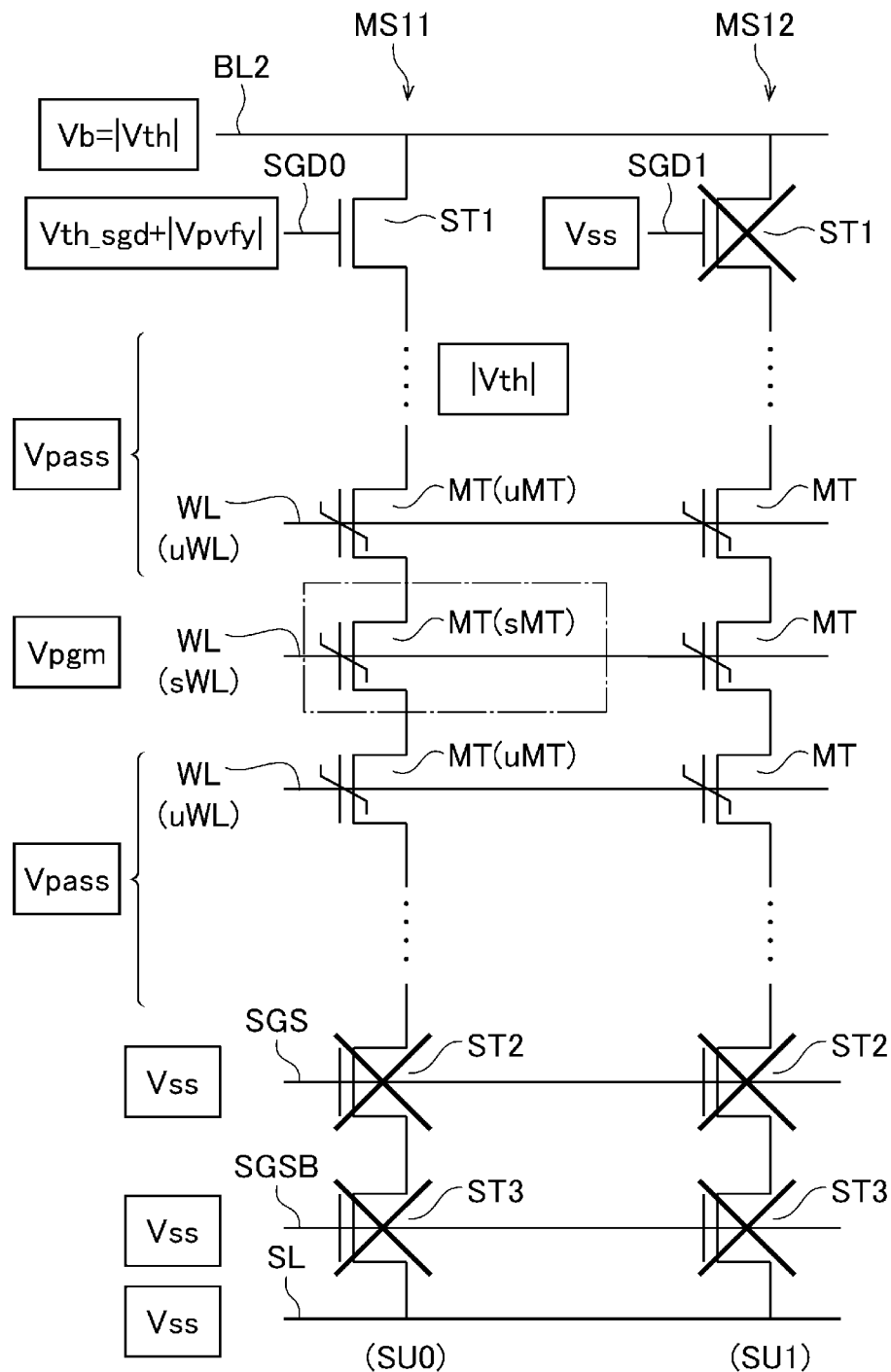
FIGS. 14-16 are diagrams schematically illustrating an operation example of the memory cell array in a pulse application operation of the second program operation according to the first embodiment.

As illustrated in FIG. 17E, at the time when the pulse application operation is started at time t18, since the ground voltage Vss is applied to the gate lines SGS and SGSB, both the source-side select transistors ST2 and ST3 are turned off. Therefore, as illustrated in FIG. 14, the bit line BL2 is in a floating state while having the charging voltage Vb. By applying the charging voltage Vb of the bit line BL2 to the channel of the memory string MS11, the writing to the selected memory cell transistor sMT is performed again.

Specifically, as illustrated in FIGS. 17C and 17D, when the pulse application operation is started at time t18, the voltage of each of the selected word line sWL and the non-selected word lines uWL is raised up to the pass voltage Vpass. Accordingly, as illustrated in FIG. 14, the selected memory cell transistor sMT and the non-selected memory cell transistor uMT are turned on. In addition, as illustrated in FIG. 17C, the voltage of the selected word line sWL is further raised up to the program voltage Vpgm at time t19.

Meanwhile, as illustrated in FIG. 17A, when the pulse application operation is started at time t18, the voltage of the gate line SGD0 is raised up to "Vth_sgd+|Vpvfy|". The "Vth_sgd" is the threshold voltage of the drain-side select transistor ST1. By applying such "Vth_sgd+|Vpvfy|" to the gate line SGD0, the drain-side select transistor ST1 is turned on or off according to the above states (a1) to (a3).

It is noted that, as illustrated in FIG. 17C, the voltage of the selected word line sWL is lowered from the program voltage Vpgm to the ground voltage Vss at time t20.

1.7.2.2.1 in Case of (a2) where Writing has not Completed

In this case, the charging voltage Vb of the bit line BL2 satisfies "Vss<Vb≤|Vpvfy|" as described above. For this reason, when the voltage of the gate line SGD0 is set to "Vth_sgd+|Vpvfy|", since a voltage difference generated between the drain and the gate of the drain-side select transistor ST1 becomes the threshold voltage Vth_sgd or more, the drain-side select transistor ST1 is turned on as illustrated in FIG. 14. As a result, the voltage |Vth| which is the charging voltage Vb of the bit line BL2 is applied to the channel of the memory string MS11 via the drain-side select transistor ST1. At this time, the selected memory cell transistor sMT is spontaneously polarized according to a voltage difference between the voltage |Vth| applied to the channel of the memory string MS11 and the program voltage Vpgm applied to the selected word line sWL. By spontaneously polarizing the selected memory cell transistor sMT in this manner, since the threshold voltage Vth of the selected memory cell transistor sMT for which the writing has not completed is shifted to a voltage lower than the verify voltage Vpvfy, the writing to the selected memory cell transistor sMT can be completed.

In addition, since a voltage higher than the ground voltage Vss is applied to the channel of the memory string MS11, as illustrated in FIG. 10, a voltage difference generated in the selected memory cell transistor sMT can be reduced in comparison to the time of performing the first program operation where the ground voltage Vss is applied to the channel of the memory string MS11. Therefore, in comparison to the first program operation, the selected memory cell transistor sMT can be spontaneously polarized in a weaker manner. When the charging voltage Vb of the bit line BL2 satisfies "Vss<Vb≤|Vpvfy|", the selected memory cell transistor sMT is in a state where the writing has not completed but some writing is performed. For this reason, by spontaneously polarizing the selected memory cell transistor sMT in a weaker manner, the writing to the selected memory cell transistor sMT can be completed while avoiding excessive spontaneous polarization of the selected memory cell transistor sMT in the second program operation.

1.7.2.2.2 In Case of (a3) when Writing has not Completed

Figure 15:
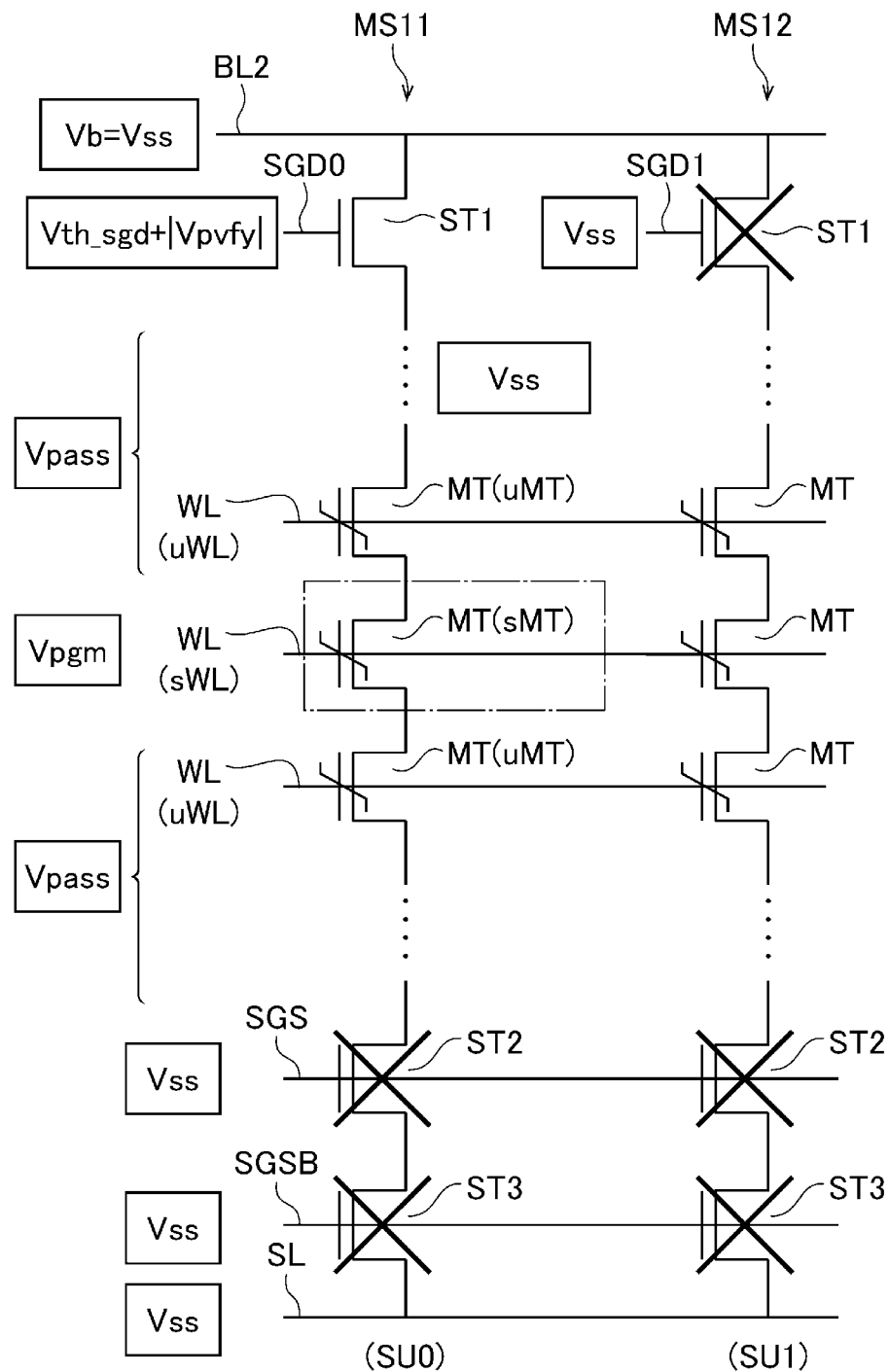

In this case, the charging voltage Vb of the bit line BL2 is set to the ground voltage Vss. For this reason, when the voltage of the gate line SGD0 is set to "Vth_sgd+|Vpvfy|", since the voltage difference generated between the drain and the gate of the drain-side select transistor ST1 is the threshold voltage Vth_sgd or more, as illustrated in FIG. 15, the drain-side select transistor ST1 is turned on. As a result, the ground voltage Vss which is the charging voltage Vb of the bit line BL2 is applied to the channel of the memory string MS11 via the drain-side select transistor ST1. At this time, the selected memory cell transistor sMT is spontaneously polarized according to the voltage difference between the ground voltage Vss applied to the channel of the memory string MS11 and the program voltage Vpgm applied to the selected word line sWL. That is, the same write operation as the first program operation is performed on the selected memory cell transistor sMT.

When the charging voltage Vb of the bit line BL2 satisfies "Vb=Vss", the writing to the selected memory cell transistor sMT is hardly performed. By performing the same write operation as the first program operation on such a selected memory cell transistor sMT, the writing to the selected memory cell transistor sMT can be completed.

1.7.2.2.3 In Case of (a1) when Writing has Completed

Figure 16:
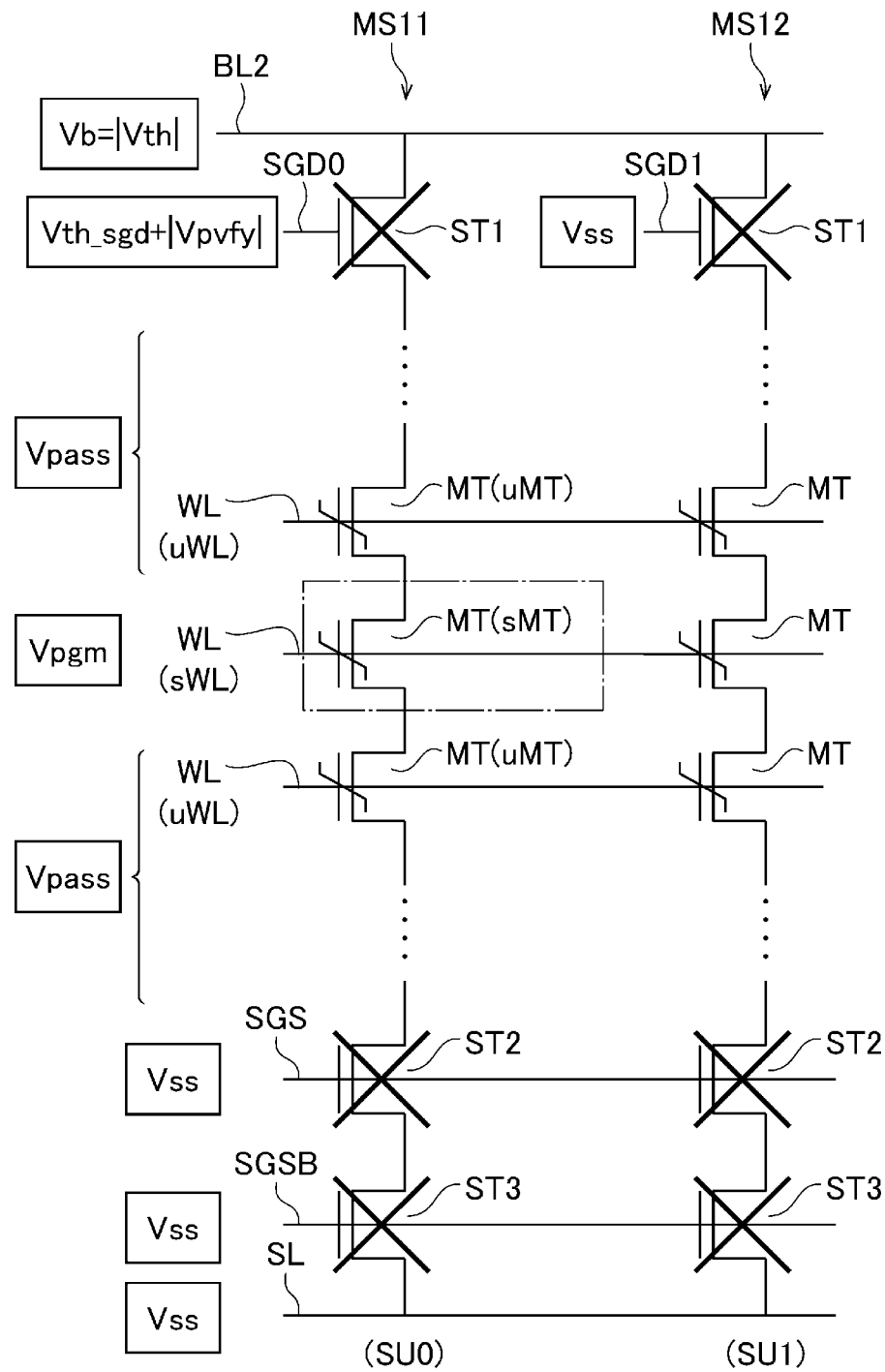

In this case, the charging voltage Vb of the bit line BL2 satisfies "Vb>|Vpvfy|". For this reason, when the voltage of the gate line SGD0 is set to "Vth_sgd+|Vpyfy|", since a voltage difference between the drain and the gate of the drain-side select transistor ST1 becomes lower than the threshold voltage Vth_sgd, as illustrated in FIG. 16, the drain-side select transistor ST1 is turned off. For this reason, the channel of the memory string MS11 is in a floating state. As a result, even when the program voltage Vpgm is applied to the selected word line sWL, the selected memory cell transistor sMT is not further spontaneously polarized.

When the charging voltage Vb of the bit line BL2 satisfies "Vb>|Vpyfy|", the selected memory cell transistor sMT is in a state where the writing has completed. Since the selected memory cell transistor sMT is not further spontaneously polarized, the selected memory cell transistor sMT for which the writing has completed can be avoided from being excessively spontaneously polarized in the second program operation.

1.7.3. Operation of Sequencer

Figure 20:
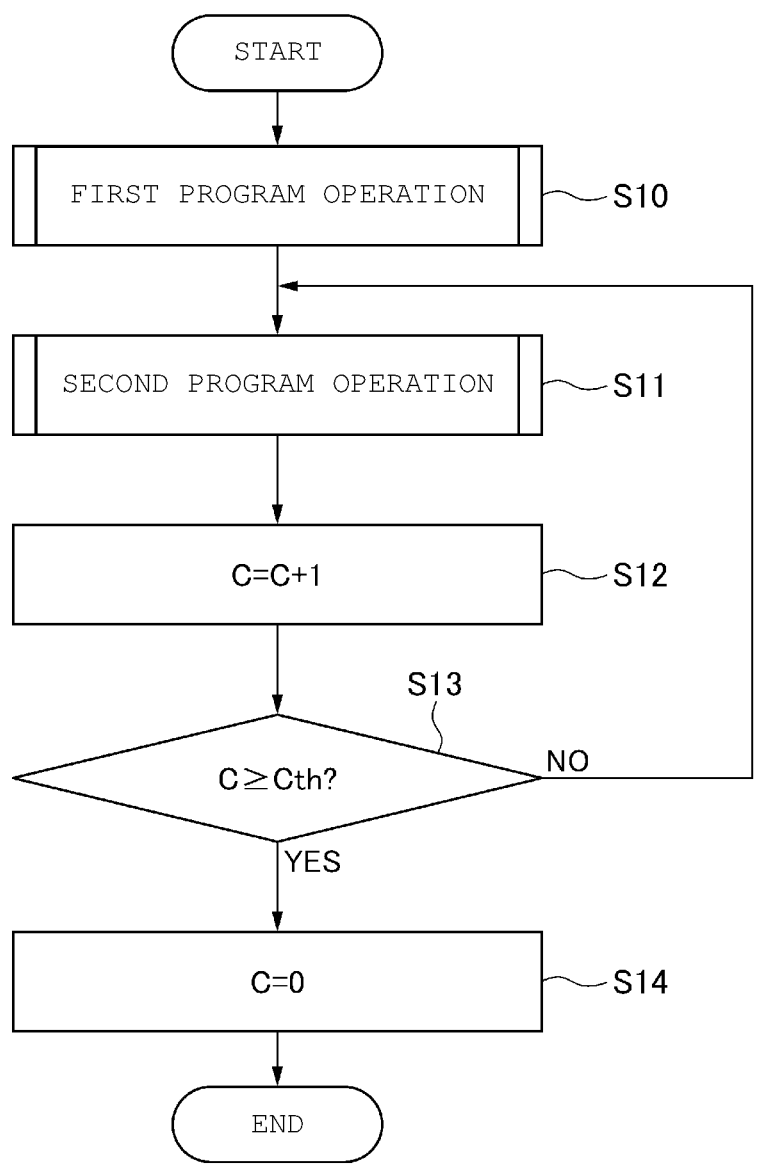
FIG. 20 is a flow chart illustrating a procedure of the write operation executed by a sequencer according to the first embodiment.

Next, the processing procedure of the write operation executed by the sequencer 41 will be specifically described with reference to FIGS. 20 and 21. It is noted that the processing illustrated in FIG. 20 is executed for a predetermined string unit SU each time when the writing of data to the selected memory cell transistor sMT corresponding to the selected word line sWL is performed. It is noted that the initial value of the counter C illustrated in FIG. 20 is set to "0".

As illustrated in FIG. 20, the sequencer 41 first executes the first program operation (step S10). Specifically, the sequencer 41 executes the write operation to the selected memory cell transistor sMT corresponding to the selected word line sWL of the selected string unit SU.

Subsequently, the sequencer 41 executes the second program operation (step S11). The sequencer 41 executes the processing illustrated in FIG. 21 as the second program operation.

Figure 21:
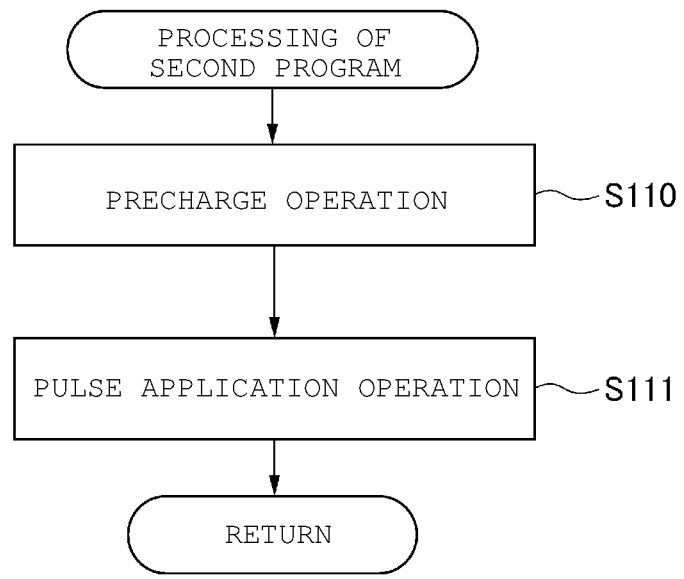
FIG. 21 is a flow chart illustrating a procedure of a second program operation executed by the sequencer according to the first embodiment.

As illustrated in FIG. 21, the sequencer 41 first executes the above-mentioned precharge operation (step S110). Specifically, the sequencer 41 turns on the drain-side select transistor ST1 and the source-side select transistors ST2 and ST3 corresponding to the selected string unit SU and applies the internal power supply voltage Vdd to the source line SL. In addition, the sequencer 41 applies the ground voltage Vss to the selected word line sWL and also applies the read pass voltage Vread to the non-selected word lines uWL. Accordingly, the bit line BL corresponding to the selected memory cell transistor sMT to which the data of "0" is written can be charged with the voltage |Vth| or the ground voltage Vss.

Subsequently, the sequencer 41 executes the pulse application operation in the second program operation (step S111). Specifically, the sequencer 41 turns off the source-side select transistors ST2 and ST3 and applies "Vth_sgd+|Vpvfy|" to the gate line SGD0. In addition, the program voltage Vpgm is applied to the selected word line sWL. Accordingly, when the writing of the data of "0" to the selected memory cell transistor sMT has completed, since the drain-side select transistor ST1 is turned off, an additional write operation to the selected memory cell transistor sMT is not performed. On the other hand, when the writing of the data of "0" to the selected memory cell transistor sMT has not completed, since the drain-side select transistor ST1 is turned on and the charging voltage Vb of the bit line BL is applied to the channel of the memory string MS, the writing according to a voltage difference between the charging voltage Vb of the bit line BL and the program voltage Vpgm to the selected memory cell transistor sMT is performed.

When the second program operation illustrated in FIG. 21 has thus completed, the sequencer 41 increments the value of the counter C (step S12) as illustrated in FIG. 20, and after that, it is determined whether the value of the counter C is the determination value Cth or more (step S13). The determination value Cth is set to an integer of 1 or more. When the value of the counter C is not the determination value Cth or more (step S13: NO), the sequencer 41 returns to the process of step S11 to execute the second program operation again. The value of the counter C is incremented each time when the second program operation is executed. Therefore, the value of the counter C is equal to the number of times of execution of the second program operation. When the value of the counter C is the determination value Cth or more (step S13: YES), the sequencer 41 initializes the value of the counter C (step S14), and after that, the processing illustrated in FIG. 20 is ended.

1.8. Function and Effect

In the semiconductor memory device 2 of this embodiment, when the sequencer 41 executes the write operation on the selected memory cell transistor sMT which is one of the memory cell transistors MT, the first program operation and the second program operation are performed. In the first program operation, the sequencer 41 applies the program voltage Vpgm to the selected word line sWL corresponding to the selected memory cell transistor sMT in a state of turning on the drain-side select transistor ST1 and turning off the source-side select transistors ST2 and ST3 and applies the ground voltage Vss lower than the program voltage Vpgm to the bit line BL, so that the threshold voltage Vth of the selected memory cell transistor sMT is lowered. The second program operation includes the precharge operation and the pulse application operation. In the precharge operation, the sequencer 41 applies the ground voltage Vss to the selected word line sWL in a state of turning on the drain-side select transistor ST1 and the source-side select transistors ST2 and ST3 after the execution of the first program operation and applies the internal power supply voltage Vdd to the source line SL, so that the bit line BL is charged. In the pulse application operation, after the precharge operation, in a state where the bit line BL is maintained to be in a floating state by the sense amplifier circuit SA, the sequencer 41 applies the program voltage Vpgm to the selected word line sWL in a state where the drain-side select transistor ST1 is turned on and the source-side select transistors ST2 and ST3 are turned off.

According to this configuration, since the rewriting to the selected memory cell transistor sMT by using the voltage charged to the bit line BL is performed, the process of allowing the sense amplifier 120 to read the data written in the selected memory cell transistor sMT and the process of setting the voltage to be applied to the bit line BL based on the data become unnecessary. Therefore, the write operation at a higher speed can be performed.

In the semiconductor memory device 2 of this embodiment, the sequencer 41 applies "Vth_sgd+|Vpyfy|" to the gate line SGD0 of the drain-side select transistor ST1 in the pulse application operation of the second program operation. "Vth_sgd+|Vpyfy|" is a voltage of turning on the drain-side select transistor ST1 when the charging voltage Vb of the bit line BL is the absolute value |Vpyfy| or less of the verify voltage and turning off the drain-side select transistor ST1 when the charging voltage Vb of the bit line BL is higher than the absolute value |Vpvfy| of the verify voltage.

According to this configuration, when the charging voltage Vb of the bit line BL is higher than the absolute value |Vpvfy| of the verify voltage, that is, when the writing to the selected memory cell transistor sMT has completed, the drain-side select transistor ST1 is turned off. For this reason, as illustrated in FIG. 16, when the program voltage Vpgm is applied to the selected word line sWL, further writing to the selected memory cell transistor sMT for which the writing has completed can be avoided.

When the charging voltage Vb of the bit line BL is the absolute value |Vpvfy| or less of the verify voltage, that is, when the writing to the selected memory cell transistor sMT has not completed, the drain-side select transistor ST1 is turned on. For this reason, as illustrated in FIGS. 14 and 15, when the program voltage Vpgm is applied to the selected word line sWL, since rewriting to the selected memory cell transistor sMT for which the writing has not completed is performed, the writing to the selected memory cell transistor sMT can be more reliably performed.

Furthermore, in the precharge operation provided in the second program operation, when the threshold voltage Vth of the selected memory cell transistor sMT is "Vpvfy≤Vth<Vss", the charging voltage Vb of the bit line BL satisfies "Vss<Vb", and when the threshold voltage Vth of the selected memory cell transistor sMT is "Vss≤Vth", the charging voltage Vb of the bit line BL becomes the ground voltage Vss. That is, in the precharge operation, the charging voltage Vb of the bit line BL is set in a self-aligning manner according to the difference between the threshold voltage Vth and the verify voltage Vpvfy of the selected memory cell transistor sMT. Accordingly, in the pulse application operation provided in the second program operation, when the difference between the threshold voltage Vth and the verify voltage Vpvfy of the selected memory cell transistor sMT is large, the threshold voltage Vth of the selected memory cell transistor sMT fluctuates greatly, and when the difference between the threshold voltage Vth and the verify voltage Vpvfy of the selected memory cell transistor sMT is small, the threshold voltage Vth of the selected memory cell transistor sMT fluctuates slightly. Accordingly, the threshold voltages Vth of the memory cell transistors MT to which the data of "0" is written can be distributed in a range that is higher than the lower limit of the Pr state illustrated in FIG. 9B and lower than the verify voltage Vpvfy. That is, the distribution of the threshold voltage Vth of the memory cell transistor MT can be narrowed.

When the value of the counter C illustrated in FIG. 20 is set to an integer of 2 or more, the sequencer 41 alternately executes the precharge operation and the pulse application operation provided in the second program operation multiple times.

According to this configuration, when there is a selected memory cell transistor sMT for which the writing has not completed, the precharge operation and the pulse application operation are repeatedly performed until the writing to the selected memory cell transistor sMT has completed, in other words, until the threshold voltage Vth of the selected memory cell transistor sMT is lower than the verify voltage Vpvfy. For this reason, the writing to the selected memory cell transistor sMT can be more reliably performed.

When executing the write operation on the selected memory cell transistor sMT, the sequencer 41 maintains the voltage applied to the bit lines BL1 and BL3 located adjacent to the bit line BL2 connected to the selected memory cell transistor sMT to be the internal power supply voltage Vdd. In this embodiment, the bit line BL2 corresponds to the first bit line, the bit lines BL1 and BL3 correspond to the second bit lines, and the internal power supply voltage Vdd corresponds to the fifth voltage.

According to this configuration, the voltage fluctuation of the bit lines BL1 and BL3 can be avoided from affecting the charging voltage Vb of the bit line BL2.

2. SECOND EMBODIMENT

Next, a second embodiment of the semiconductor memory device 2 will be described. The following description focuses on the differences from the semiconductor memory device 2 according to the first embodiment.

2.1. Operation of Sequencer

Figure 22:
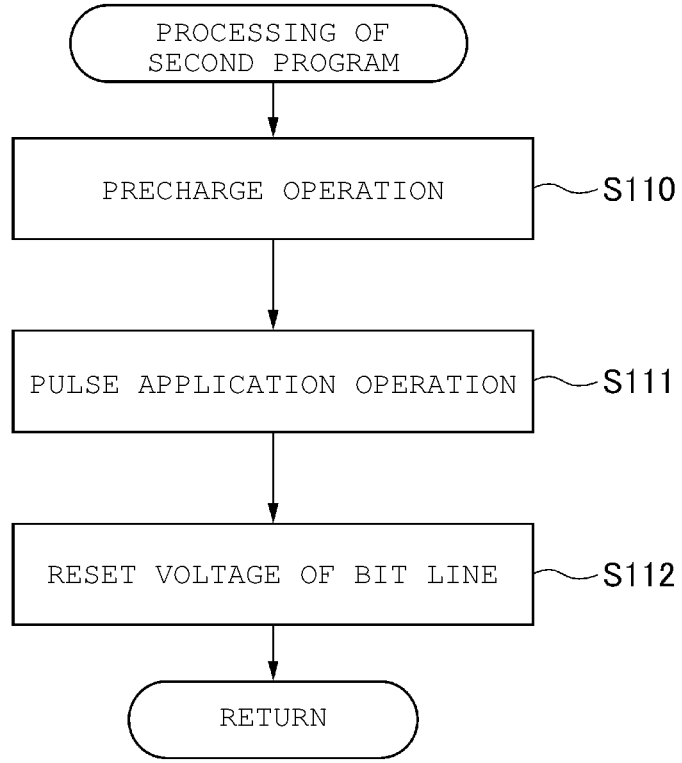
FIG. 22 is a flow chart illustrating a procedure of a second program operation executed by a sequencer according to a second embodiment.

FIG. 22 illustrates the processing procedure of the second program operation executed by the sequencer 41 of this embodiment. It is noted that, in the following also, the case where the data of "0" is stored in the latch circuit SDL of the sense amplifier unit SAU corresponding to the bit line BL2, and the data of "1" is stored in the latch circuit SDL of the sense amplifier unit SAU corresponding to the bit line BL4 will be described as an example.

Figure 23:
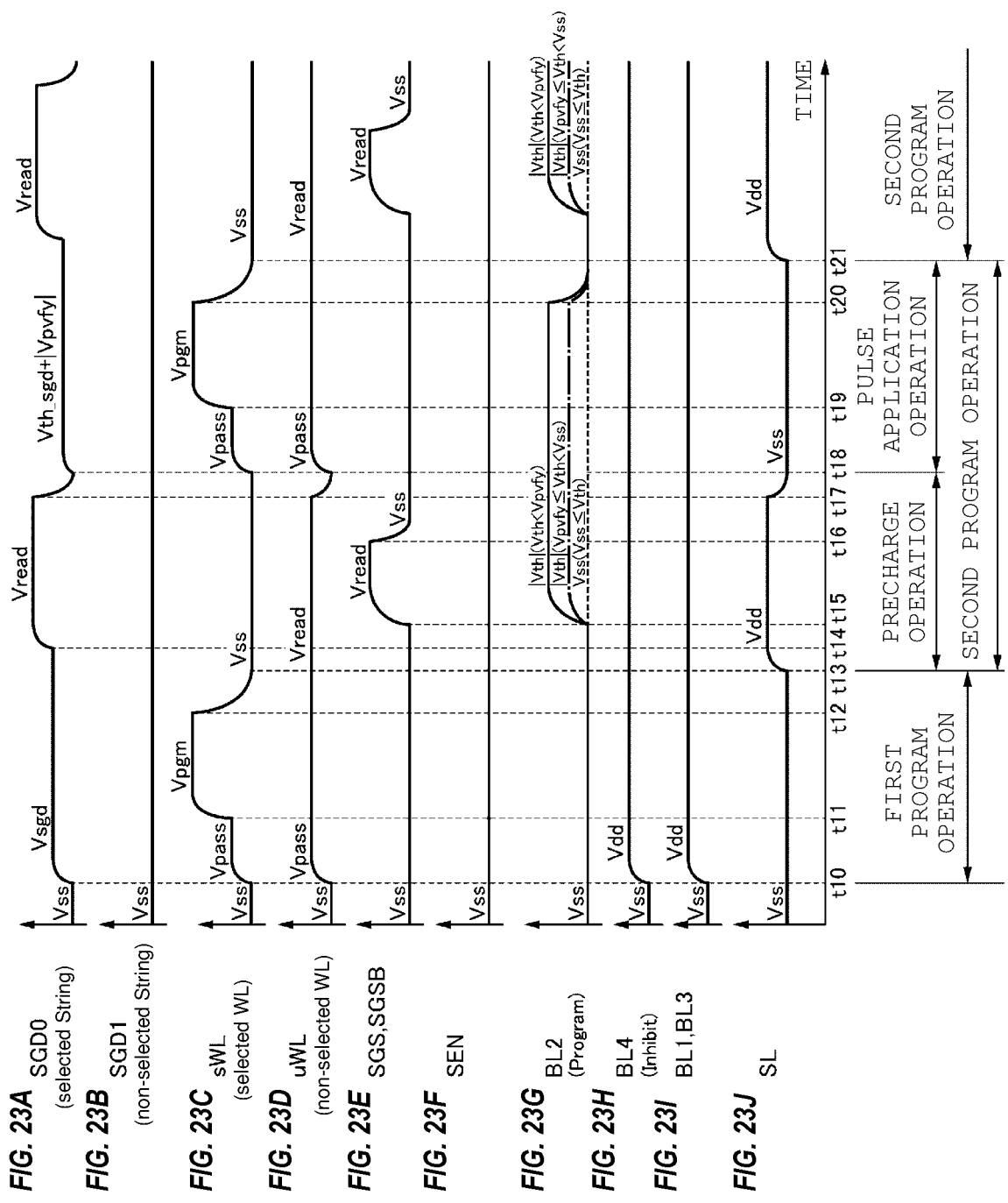
FIGS. 23A to 23J are timing charts illustrating voltage transitions of various components of the memory cell array during the write operation according to the second embodiment.
Figure 24:
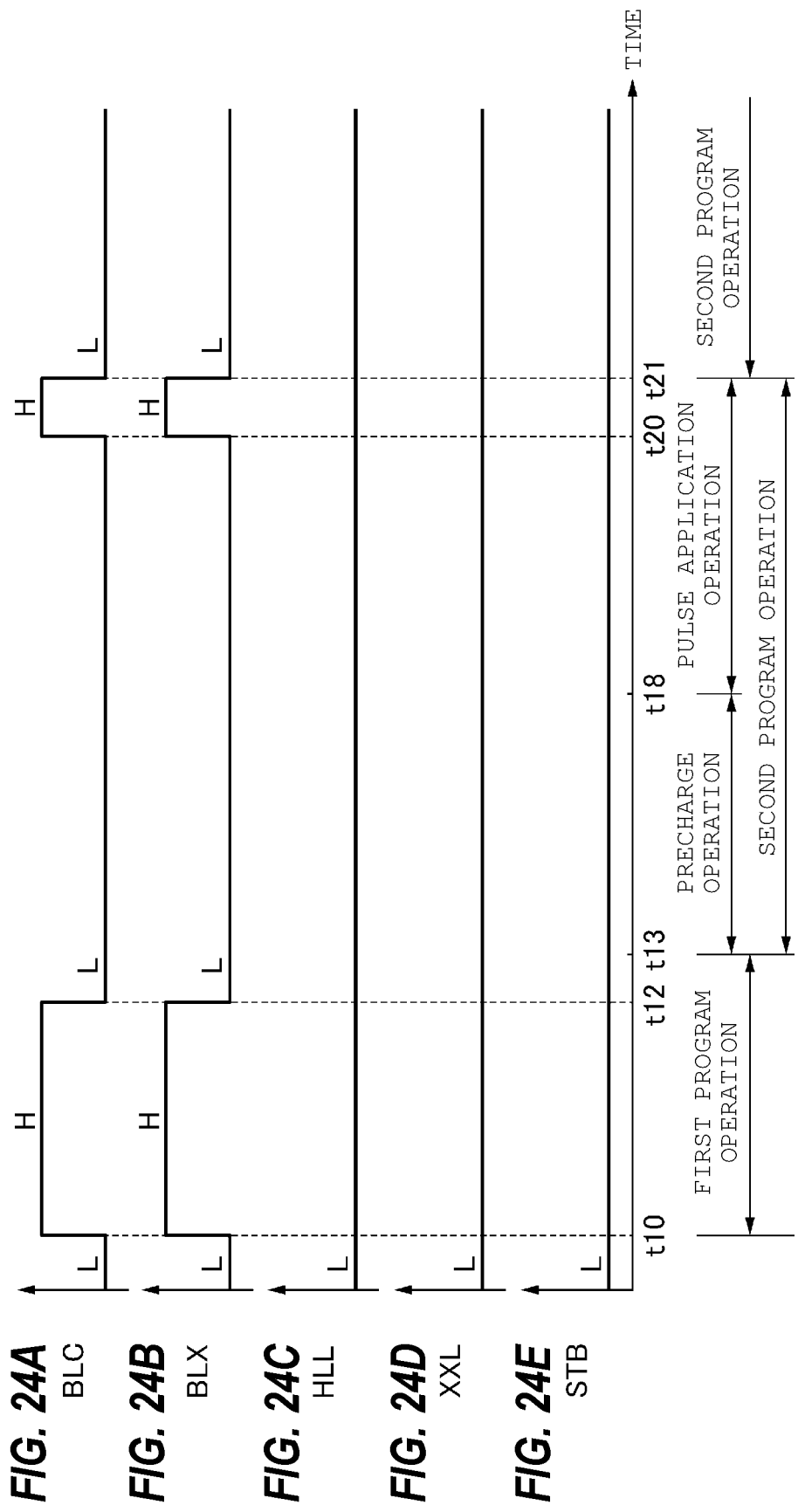
FIGS. 24A to 24E are timing charts illustrating transitions in signals applied to a sense amplifier unit during the write operation according to the second embodiment.

After the execution of the pulse application operation (step S111), the sequencer 41 resets the voltage of the bit line BL of the selected string unit SU0 (step S112). Specifically, as illustrated in FIG. 23G, when the voltage of the bit line BL2 is lowered to the ground voltage Vss at time t20, the signals BLC and BLX of the sense amplifier 120 are set to a high level as illustrated in FIGS. 24A and 24B. Accordingly, when the data of "1" is stored in the latch circuit SDL of the sense amplifier unit SAU, the voltage of the internal power supply voltage Vdd is applied to the bit line BL. On the other hand, when the data of "0" is stored in the latch circuit SDL of the sense amplifier unit SAU, the voltage of the node SRC, that is, the ground voltage Vss is applied to the bit line BL. Accordingly, as illustrated in FIG. 23G, the voltage of the bit line BL2 is lowered to the ground voltage Vss and reset at time t20. After that, at time t21, the second program operation is started again.

2.2. Function and Effect

In the semiconductor memory device 2 of this embodiment, after the sequencer 41 performs the pulse application operation of the second program operation and before performing the precharge operation of the next second program operation, the sense amplifier 120 performs the reset operation of resetting the voltage of the bit line BL based on the data stored in the latch circuit SDL.

According to this configuration, the next second program operation can be avoided from being started, for example, while maintaining the state where the bit line BL2 is charged with the voltage |Vth|, that is, while the bit line BL2 is maintained to be in a floating state. When the bit line BL2 is in a floating state, since the voltage of the bit line BL2 is likely to become unstable, the unstable state of the bit line BL2 is eliminated by temporarily lowering the voltage of the bit line BL2 to the ground voltage Vss, and thus, the next second program operation can be started. As a result, the second program operation at higher accuracy can be executed.

3. THIRD EMBODIMENT

Next, a third embodiment of the semiconductor memory device 2 will be described. The following description focuses on the differences from the semiconductor memory device 2 according to the first embodiment.

3.1 Configuration of Sense Amplifier

Figure 25:
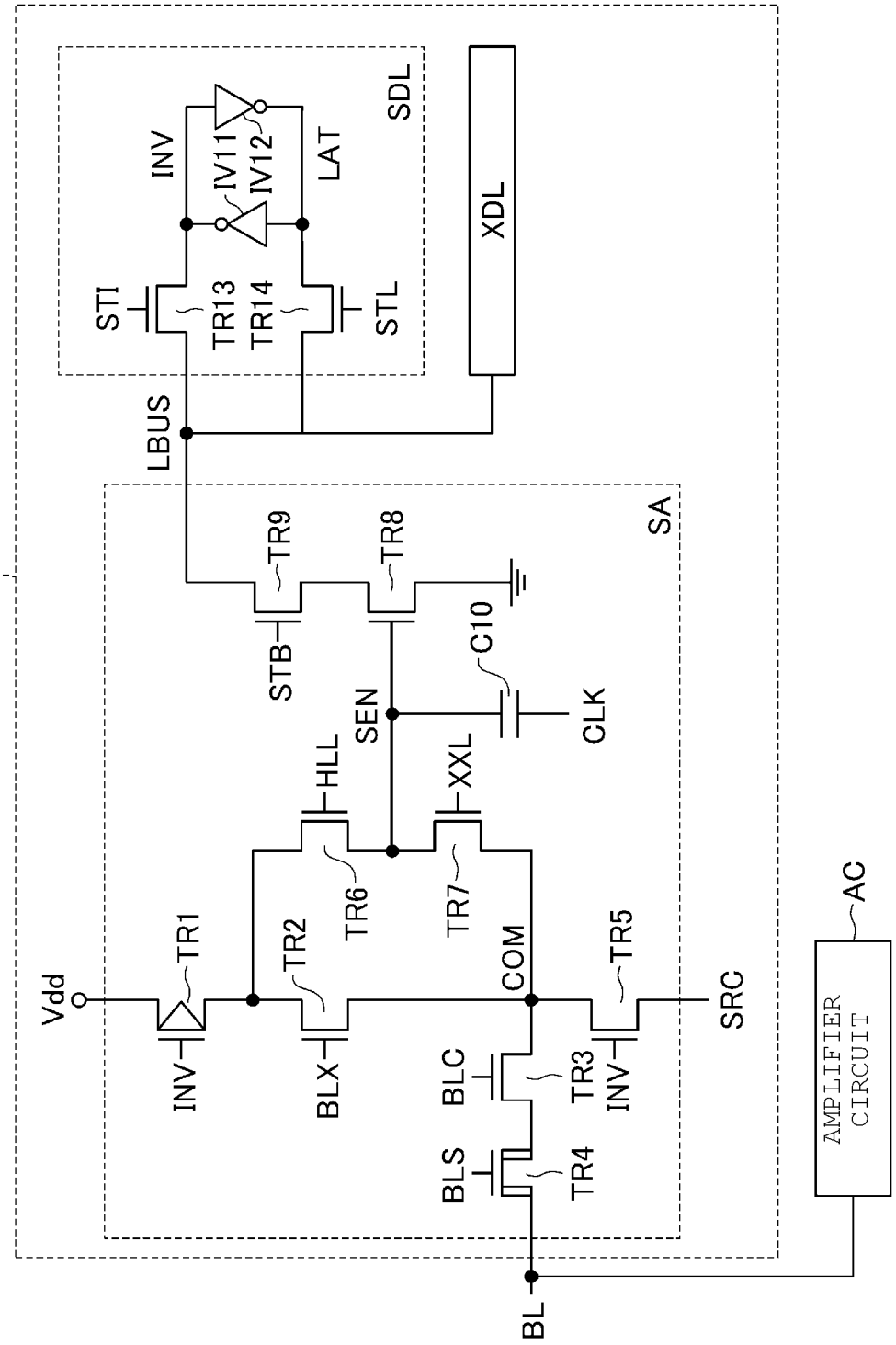
FIG. 25 is a circuit diagram illustrating a circuit configuration of a sense amplifier unit according to a third embodiment.

FIG. 25 illustrates a configuration example of a sense amplifier 120 of this embodiment. As illustrated in FIG. 25, the sense amplifier unit SAU and the amplifier circuit AC are electrically connected in parallel to the bit line BL. The sense amplifier unit SAU has the same configuration as the sense amplifier unit SAU illustrated in FIG. 6. The amplifier circuit AC is a circuit for amplifying the charging voltage Vb of the bit line BL. In this embodiment, the amplifier circuit AC corresponds to a voltage adjustment circuit.

3.2 Sequencer Operation

Figure 26:
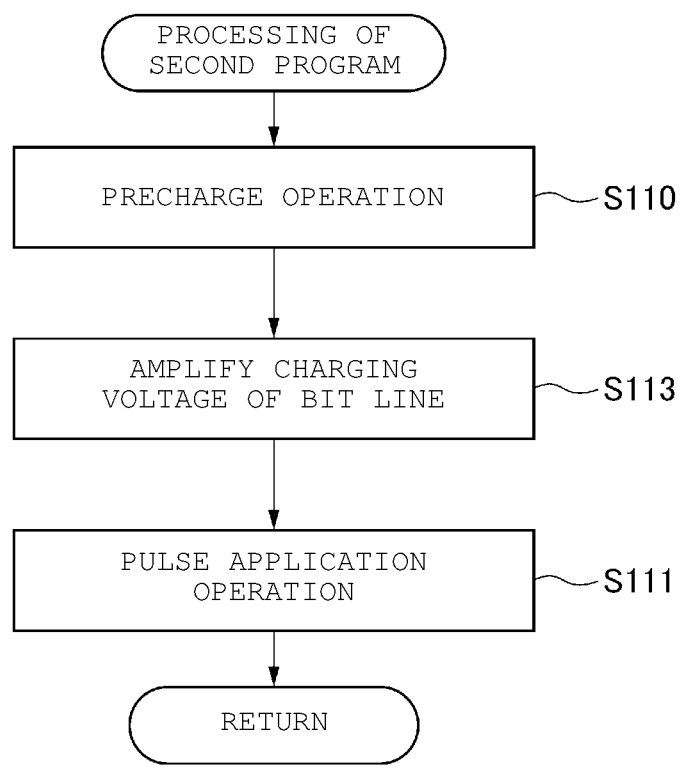
FIG. 26 is a flow chart illustrating a procedure of a second program operation executed by a sequencer according to the third embodiment.

FIG. 26 illustrates a processing procedure of the second program operation executed by the sequencer 41 of this embodiment. It is noted that, in the following also, the case where the data of "0" is stored in the latch circuit SDL of the sense amplifier unit SAU corresponding to the bit line BL2, and the data of "1" is stored in the latch circuit SDL of the sense amplifier unit SAU corresponding to the bit line BL4 will be described as an example.

After the execution of the precharge operation (step S110), the sequencer 41 executes an amplify operation of amplifying the charging voltage Vb of the bit line BL (step S113). Specifically, as illustrated in FIG. 27E, after the voltages of the gate lines SGS and SGSB are lowered from the read pass voltage Vread to the ground voltage Vss at time t16, that is, after the source-side select transistors ST2 and ST3 are turned off, the charging voltage Vb of the bit line BL2 is amplified by the amplifier circuit AC illustrated in FIG. 25 at time t16a. When the charging voltage Vb of the bit line BL2 is higher than the absolute value |Vpvfy| of the verify voltage, the amplifier circuit AC raises the charging voltage Vb of the bit line BL2 up to the internal power supply voltage Vdd as indicated by a solid line in FIG. 27E. Therefore, when the writing to the selected memory cell transistor sMT has completed, the charging voltage Vb of the bit line BL2 is set to the internal power supply voltage Vdd. On the other hand, when the charging voltage Vb of the bit line BL2 is the absolute value |Vpvfy| or less of the verify voltage, the amplifier circuit AC lowers the charging voltage Vb of the bit line BL2 down to the ground voltage Vss as indicated by a one-dot dashed line in FIG. 27E. Therefore, when the writing to the selected memory cell transistor sMT has not completed, the charging voltage Vb of the bit line BL2 is set to the ground voltage Vss.

As illustrated in FIG. 26, the sequencer 41 executes the pulse application operation following the process of step S113 (step S111). At this time, as illustrated in FIG. 27A, when the pulse application operation is started at time t18, the voltage Vsgd is applied to the gate line SGD0 of the selected string unit SU0. Accordingly, when the writing to the selected memory cell transistor sMT has completed and the charging voltage Vb of the bit line BL2 is set to the internal power supply voltage Vdd, the drain-side select transistor ST1 is turned off. For this reason, since the channel of the memory string MS11 is in a floating state, the writing to the selected memory cell transistor sMT is not performed. On the other hand, when the writing to the selected memory cell transistor sMT has not completed and the charging voltage Vb of the bit line BL2 is set to the ground voltage Vss, the drain-side select transistor ST1 is turned on. For this reason, since the ground voltage Vss is applied to the channel of the memory string MS11, the selected memory cell transistor sMT is spontaneously polarized based on the voltage difference between the ground voltage Vss applied to the channel of the memory string MS11 and the program voltage Vpgm applied to the selected word line sWL. Therefore, the writing to the selected memory cell transistor sMT is performed.

3.3 Function and Effect

The semiconductor memory device 2 further includes an amplifier circuit AC that adjusts the voltage charged on the bit line BL by the precharge operation of the second program operation.

According to this configuration, the voltage Vsgd used in the first program operation can be used as it is as the voltage applied to the gate line SGD0 of the selected string unit SU0 in the pulse application operation of the second program operation.

4. OTHER EMBODIMENTS

The present disclosure is not limited to the above specific examples.

For example, the magnitudes of various voltages such as the program voltage Vpgm and the internal power supply voltage Vdd can be freely changed. In addition, the voltage applied to the gate line SGD0 of the drain-side select transistor ST1 in the pulse application operation of the second program operation can be changed.

In the semiconductor memory device 2 according to the third embodiment, the sense amplifier unit SAU may incorporate the function of the amplifier circuit AC.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
    a memory string having a first select transistor having a first end connected to a bit line, a second select transistor having a first end connected to a source line, and a plurality of memory cell transistors connected in series between a second end of the first select transistor and a second end of the second select transistor;
    a plurality of word lines respectively connected to gates of the plurality of memory cell transistors;
    a sense amplifier unit connected to the bit line, wherein the sense amplifier unit includes a latch circuit storing data to be written to the memory cell transistors, and a sense amplifier circuit capable of applying a voltage to the bit line based on the data stored in the latch circuit; and
    a control circuit configured to control voltages applied to the plurality of word lines, the bit line, and the source line,
    wherein, when performing a write operation on a first memory cell transistor, which is one of the memory cell transistors, the control circuit performs
    a first pulse application operation of lowering a threshold voltage of the first memory cell transistor, the first pulse application operation including applying a first voltage to a first word line corresponding to the first memory cell transistor among the plurality of word lines and applying a second voltage lower than the first voltage to the bit line in a state in which the first select transistor is turned on and the second select transistor is turned off,
    a precharge operation of charging the bit line, the precharge operation including applying a third voltage lower than the first voltage to the first word line and applying a fourth voltage higher than the third voltage to the source line; in a state in which, after the execution of the first pulse application operation, the first select transistor and the second select transistor are turned on, and then
    a second pulse application operation that includes applying the first voltage to the first word line in a state in which the bit line is set to a floating state by the sense amplifier unit by turning on the first select transistor and turning off the second select transistor.

2. The semiconductor memory device according to claim 1, wherein the third voltage is the same as the second voltage.

3. The semiconductor memory device according to claim 2, wherein the second voltage and the third voltage are ground voltages.

4. The semiconductor memory device according to claim 3, wherein the control circuit charges the bit line with a voltage corresponding to the threshold voltage of the first memory cell transistor in the precharge operation.

5. The semiconductor memory device according to claim 4, wherein the control circuit
    determines that the writing of the first memory cell transistor has completed based on the threshold voltage of the first memory cell transistor being lower than a writing determination voltage set to a negative value, and
    applies, to the gate line of the first select transistor, a voltage capable of turning on the first select transistor when a charging voltage of the bit line is less than or equal to an absolute value of the writing determination voltage, and turning off the first select transistor when the charging voltage of the bit line is greater than the absolute value of the writing determination voltage, in the second pulse application operation.

6. The semiconductor memory device according to claim 1, wherein the control circuit alternately performs the precharge operation and the second pulse application operation a multiple number of times.

7. The semiconductor memory device according to claim 6, wherein the control circuit performs a reset operation of allowing the sense amplifier unit to reset the voltage of the bit line after performing the second pulse application operation and before performing the precharge operation.

8. The semiconductor memory device according to claim 1, further comprising a voltage adjustment circuit configured to adjust the voltage charged to the bit line by the precharge operation.

9. The semiconductor memory device according to claim 1, further comprising:
a second bit line located adjacent to a first bit line that is connected to the first memory cell transistor,
wherein the control circuit is configured to maintain a voltage applied to the second bit line at a fifth voltage when performing the write operation on the first memory cell transistor.

10. The semiconductor memory device according to claim 1, wherein the memory cell transistors are each a ferroelectric transistor.

11. A method of performing a write operation on a first memory transistor of a semiconductor memory device that includes:
a memory string having a first select transistor having a first end connected to a bit line, a second select transistor having a first end connected to a source line, and a plurality of memory cell transistors, including the first memory transistor, connected in series between a second end of the first select transistor and a second end of the second select transistor;
a plurality of word lines respectively connected to gates of the plurality of memory cell transistors;
a sense amplifier unit connected to the bit line, wherein the sense amplifier unit includes a latch circuit storing data to be written to the memory cell transistors, and a sense amplifier circuit capable of applying a voltage to the bit line based on the data stored in the latch circuit; and
a control circuit configured to control voltages applied to the plurality of word lines, the bit line, and the source line, said method comprising:
performing a first pulse application operation of lowering a threshold voltage of the first memory cell transistor, the first pulse application including applying a first voltage to a first word line corresponding to the first memory cell transistor among the plurality of word lines and applying a second voltage lower than the first voltage to the bit line in a state in which the first select transistor is turned on and the second select transistor is turned off;
performing a precharge operation of charging the bit line, the precharge operation including applying a third voltage lower than the first voltage to the first word line and applying a fourth voltage higher than the third voltage to the source line; in a state in which, after the execution of the first pulse application operation, the first select transistor and the second select transistor are turned on, and then
performing a second pulse application operation that includes applying the first voltage to the first word line in a state in which the bit line is set to a floating state by the sense amplifier unit by turning on the first select transistor and turning off the second select transistor.

12. The method according to claim 11, wherein the third voltage is the same as the second voltage.

13. The method according to claim 12, wherein the second voltage and the third voltage are ground voltages.

14. The method according to claim 13, wherein the control circuit charges the bit line with a voltage corresponding to the threshold voltage of the first memory cell transistor in the precharge operation.

15. The method according to claim 14, further comprising:
determining that the writing of the first memory cell transistor has completed based on the threshold voltage of the first memory cell transistor being lower than a writing determination voltage set to a negative value, and
applying, to the gate line of the first select transistor, a voltage capable of turning on the first select transistor when a charging voltage of the bit line is less than or equal to an absolute value of the writing determination voltage, and turning off the first select transistor when the charging voltage of the bit line is greater than the absolute value of the writing determination voltage, in the second pulse application operation.

16. The method according to claim 11, wherein the precharge operation and the second pulse application operation are alternately performed a multiple number of times.

17. The method according to claim 16, further comprising:
performing a reset operation of allowing the sense amplifier unit to reset the voltage of the bit line after performing the second pulse application operation and before performing the precharge operation.

18. The method according to claim 11, further comprising:
adjusting the voltage charged to the bit line by the precharge operation.

19. The method according to claim 11, wherein a voltage applied to a second bit line located adjacent to a first bit line that is connected to the first memory cell transistor, is maintained at a fifth voltage when performing the write operation on the first memory cell transistor.

20. The method according to claim 11, wherein the memory cell transistors are each a ferroelectric transistor.

* * * * *